(12) United States Patent
Chen et al.

(10) Patent No.: US 8,383,502 B2
(45) Date of Patent: Feb. 26, 2013

(54) INTEGRATED HIGH-K/METAL GATE IN CMOS PROCESS FLOW

(75) Inventors: Ryan Chia-Jen Chen, Chiayi (TW); Yih-Ann Lin, Jhudong Township, Hsinchu County (TW); Jr Jung Lin, Wurih Township, Taichung County (TW); Yi-Shien Mor, Hsinchu (TW); Chien-Hao Chen, Chuangwei Township, Ilan County (TW); Kuo-Tai Huang, Hsinchu (TW); Yi-Hsing Chen, Changhua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/186,572

(22) Filed: Jul. 20, 2011

(65) Prior Publication Data

US 2011/0275212 A1 Nov. 10, 2011

Related U.S. Application Data

(62) Division of application No. 12/478,509, filed on Jun. 4, 2009, now Pat. No. 8,003,507.

(60) Provisional application No. 61/089,721, filed on Aug. 18, 2008, provisional application No. 61/111,220, filed on Nov. 4, 2008.

(51) Int. Cl.
*H01L 21/3205* (2006.01)
*H01L 21/4763* (2006.01)

(52) U.S. Cl. ........ 438/592; 438/142; 438/199; 438/275; 438/287; 257/369; 257/407

(58) Field of Classification Search .................. 257/274, 257/314, 369, 377, 407, 750, 758; 438/142, 438/199, 275, 287, 592
See application file for complete search history.

(56) References Cited

U.S. PATENT DOCUMENTS

| | | | |
|---|---|---|---|
| 6,974,764 B2 | 12/2005 | Brask et al. |
| 7,432,567 B2 | 10/2008 | Doris et al. |
| 7,671,471 B2 | 3/2010 | Brask et al. |
| 7,682,891 B2 | 3/2010 | Lavoie et al. |
| 2005/0250258 A1 | 11/2005 | Metz et al. |
| 2007/0048920 A1 | 3/2007 | Song et al. |
| 2009/0230479 A1 | 9/2009 | Hsu et al. |

*Primary Examiner* — Kimberly Rizkallah
*Assistant Examiner* — Errol Fernandes
(74) *Attorney, Agent, or Firm* — Haynes and Boone, LLP

(57) ABSTRACT

A method of fabricating a semiconductor device includes providing a semiconductor substrate having a first active region and a second active region, forming a first metal layer over a high-k dielectric layer, removing at least a portion of the first metal layer in the second active region, forming a second metal layer on first metal layer in the first active region and over the high-k dielectric layer in the second active region, and thereafter, forming a silicon layer over the second metal layer. The method further includes removing the silicon layer from the first gate stack thereby forming a first trench and from the second gate stack thereby forming a second trench, and forming a third metal layer over the second metal layer in the first trench and over the second metal layer in the second trench.

15 Claims, 25 Drawing Sheets

INTEGRATED HIGH-K/METAL GATE IN CMOS PROCESS FLOW

PRIORITY DATA

This application is a divisional of U.S. Ser. No. 12/478,509 filed Jun. 4, 2009, and entitled, "Method Of Integrating High-K/Metal Gate In CMOS Process Flow," which claims priority to Provisional Ser. No. 61/089,721 filed on Aug. 18, 2008, and to Provisional Ser. No. 61/111,220 filed on Nov. 4, 2008, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow due to various factors such as incompatibility of materials, complex processes, and thermal budgets.

Accordingly, what is needed is a method for integrating a high-k/metal gate in a CMOS process flow.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Referring to FIGS. 1A to 1D, illustrated are cross-sectional views of a semiconductor device 100 at various stages of fabrication in a hybrid gate process including a gate first process and a gate last process. In the gate first process, a true metal gate structure may be formed first and may be followed by CMOS process flow to fabricate the final device. In the gate last process, a dummy poly gate structure may be formed first and may be followed normal CMOS process flow until deposition of an interlayer dielectric (ILD), and thereafter the dummy poly gate structure may be removed and replaced with a true metal gate structure. In the hybrid gate process, the metal gate for an N-type MOS (NMOS) device may be formed first and the metal gate for a P-type (PMOS) device may be formed last as discussed below. Alternatively, the metal gate for the PMOS device may be formed first and the metal gate for the NMOS may be formed last. It is understood that the semiconductor device 100 may be fabricated with known CMOS technology processes, and thus some processes are only briefly described herein.

Figure 1A:
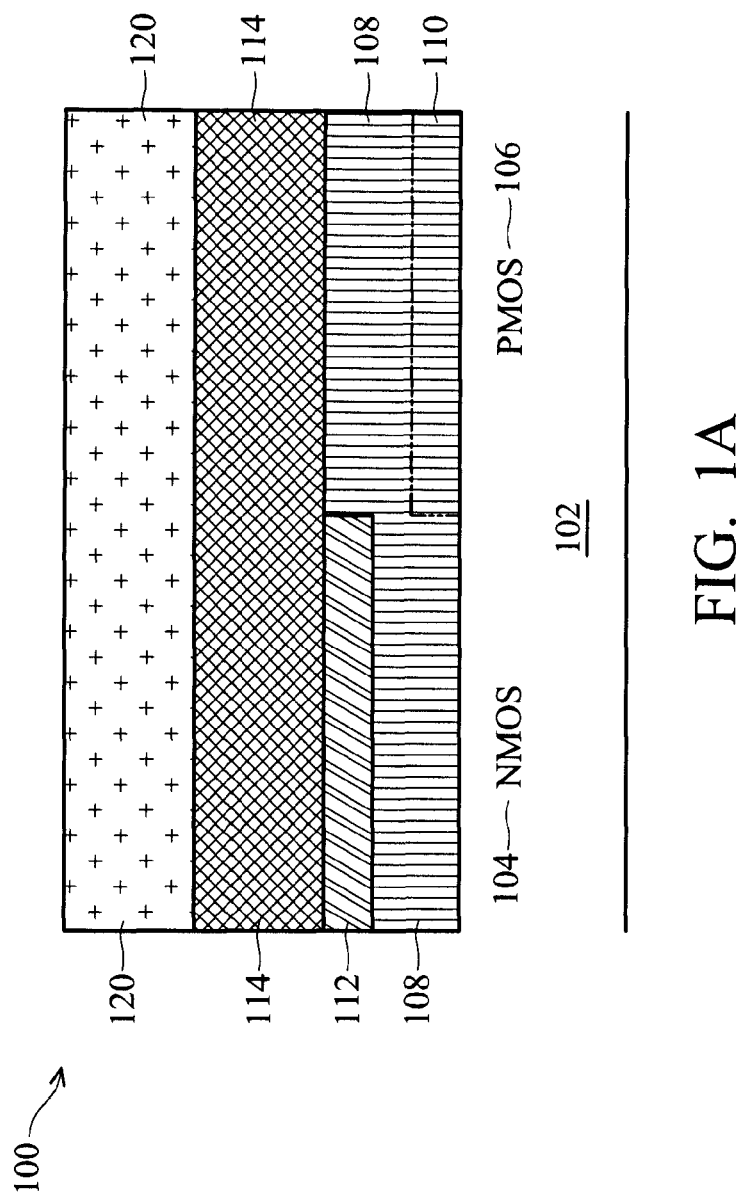
FIGS. 1A to 1D are cross-sectional views of a semiconductor device at various stages of fabrication in a hybrid process including a gate first process and a gate last process.

It is understood that FIGS. 1A to 1D are simplified for a better understanding of the disclosed embodiments. For example, the semiconductor 100 may undergo a CMOS process flow until deposition of an interlayer dielectric (ILD), and various features may be formed but are not illustrated such as gate stacks, lightly doped drain (LDD) regions, sidewall spacers, source/drain (S/D) regions, silicide regions, contact etch stop layer (CESL), and other suitable features. Further, FIGS. 1A to 1D conceptually illustrate the gate structures of an NMOS device and PMOS device, respectively. In FIG. 1A, the semiconductor device 100 is shown following a chemical mechanical polishing (CMP) process on the interlayer dielectric (ILD) that exposes a dummy poly layer of the gate structures in the NMOS region and PMOS region, respectively.

In FIG. 1A, the semiconductor device 100 may include a semiconductor substrate 102 such as a silicon substrate. The substrate 102 may alternatively include silicon germanium, gallium arsenic, or other suitable semiconductor materials. The substrate 102 may further include other features such as various doped regions, a buried layer, and/or an epitaxy layer. Furthermore, the substrate 102 may be a semiconductor on insulator such as silicon on insulator (SOI). In other embodiments, the semiconductor substrate 102 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 100 may further include an isolation structure (not shown) such as a shallow trench isolation (STI) feature formed in the substrate 102 for isolating active regions 104 and 106 in the substrate. The isolation structure may be formed of silicon oxide, silicon nitride, silicon oxynitride, fluoride-doped silicate (FSG), and/or a low k dielectric material known in the art. The active region 104 may be configured for an N-type metal-oxide-semiconductor transistor device (referred to as NMOS) and the active region 106 may be configured for a P-type MOS transistor device (referred to as PMOS).

The semiconductor device 100 may further include an interfacial layer (not shown) formed over the substrate 102. The interfacial layer may include a silicon oxide layer having a thickness ranging from about 5 to about 15 angstrom (A). The semiconductor device 100 may further include a high-k dielectric layer 108 formed on the interfacial layer. The high-k dielectric layer 108 may be formed by atomic layer deposition (ALD) or other suitable technique. The high-k dielectric layer 108 may include a thickness ranging from about 10 to about 30 angstrom (A). The high-k dielectric layer 108 may include hafnium oxide (HfO2). Alternatively, the high-k dielectric layer 108 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium lanthanum oxide (HfLaO), hafnium lutetium oxide (HfLuO), and combinations thereof.

The semiconductor device 100 may further include a capping layer for tuning a work function of a metal layer (for the gate electrode) for properly performing as an NMOS transistor device 104 and a PMOS transistor device 106, respectively. For example, a capping layer 110 such as aluminum oxide (Al2O3) may be formed in the PMOS region 106. The capping layer 110 may include a thickness ranging from about 3 to about 20 angstrom (A). A capping layer 112 such as lanthanum oxide (LaOx) may be formed in the NMOS region 104. The capping layer 112 may include a thickness ranging from about 3 to about 20 angstrom (A).

The semiconductor device 100 may further include a metal layer 114 formed over the high-k dielectric layer 108. The metal layer 114 may have a first work function such as an N-metal work function (N-metal). For example, the metal layer 114 may include TiN having a thickness ranging from about 10 to about 200 angstrom (A). The TiN metal layer/lanthanum oxide capping layer may perform with an effective work function of an N-metal. The metal layer 114 may be formed by various deposition techniques such as chemical vapor deposition (CVD), physical vapor deposition (PVD or sputtering), plating, or other suitable technique. Alternatively, the metal layer 114 may optionally include TaC, TaN, or other suitable metals. The semiconductor device 100 may further include a polysilicon (or poly) layer 120 formed over the metal layer 114 by a suitable deposition process. The poly layer 120 may include a thickness ranging from about 400 to about 800 angstrom (A). The semiconductor device 100 may further include a hard mask layer (not shown), such as silicon nitride or silicon oxynitride, formed on the poly layer 120.

Figure 1B:
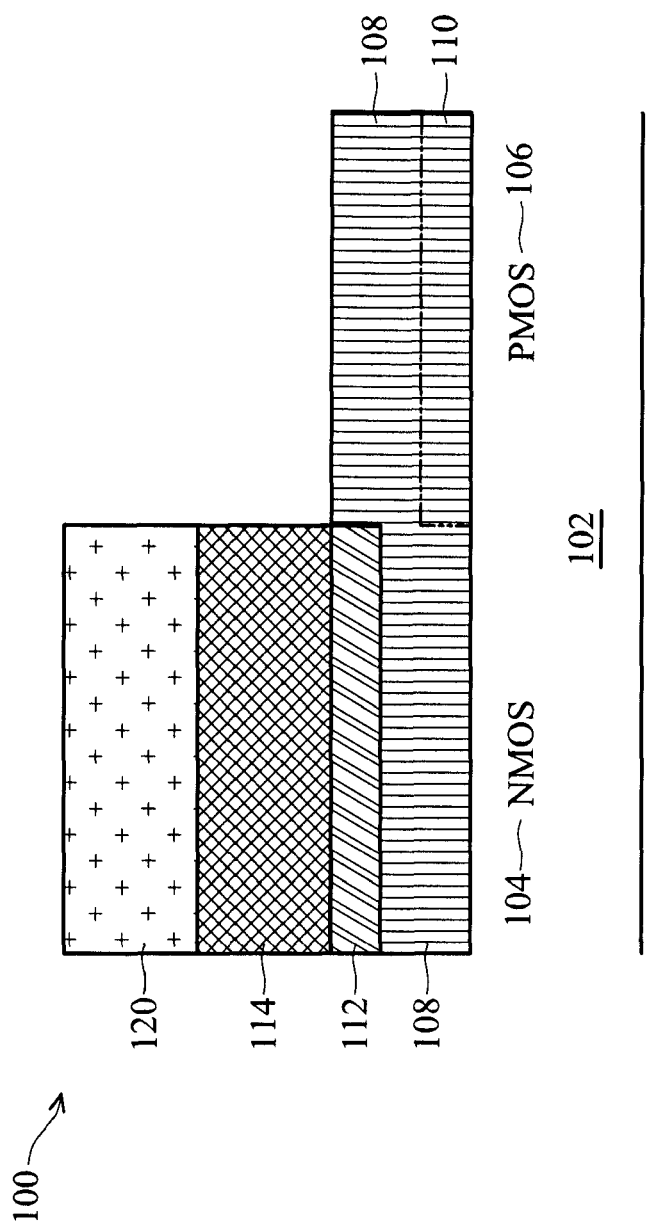

In FIG. 1B, the poly layer 120 and the metal layer 114 in the PMOS region 106 may be removed. For example, an N/P photolithography patterning process (PMOS N/P patterning) may be performed to separate the NMOS region 104 and the PMOS region 106. The photolithography process may include spin coating, soft-baking, exposure, post-baking, developing, rinsing, drying, and other suitable process. Alternatively, the N/P patterning may be performed by immersion lithography, electron beam lithography, or other suitable process. The poly layer 120 in the PMOS region 106 may be removed by an etch back process or other suitable process. Following removal of the poly layer 120 in the PMOS region 106, the photoresist may be removed or stripped with ash process and the semiconductor device 100 may undergo a polymer dip to remove residues left from the poly etch back process and ash process. The metal layer 114 (e.g., N-metal work function) in the PMOS region 106 may be removed by a wet or dry etch process.

Figure 1C:
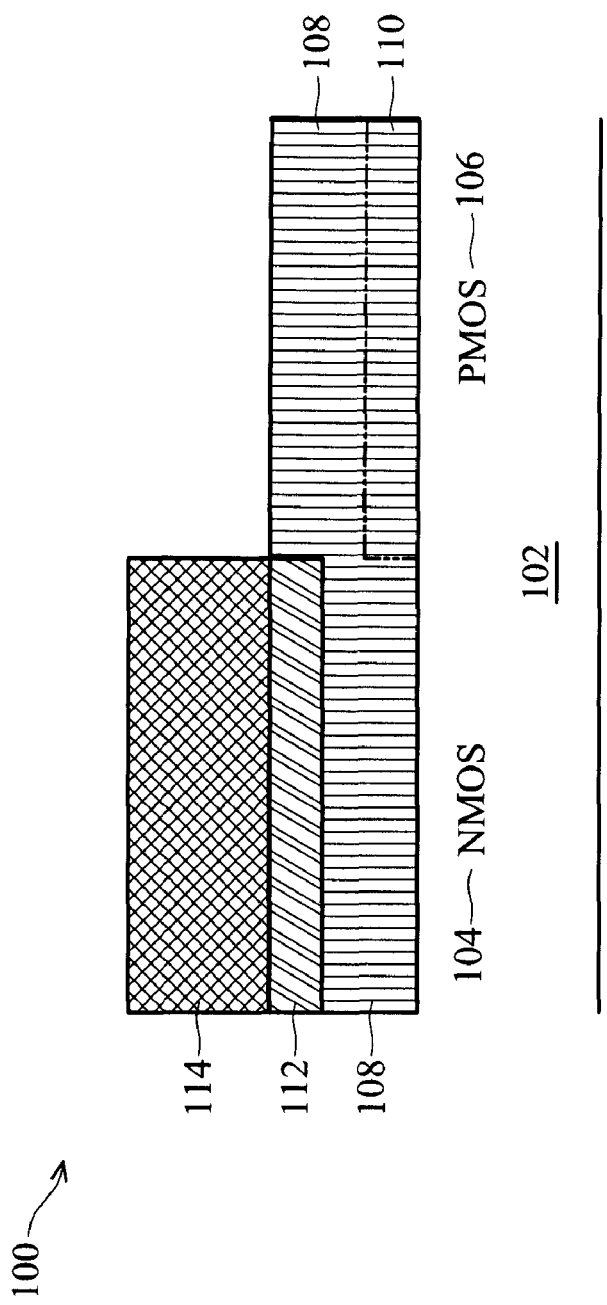
Figure 1D:
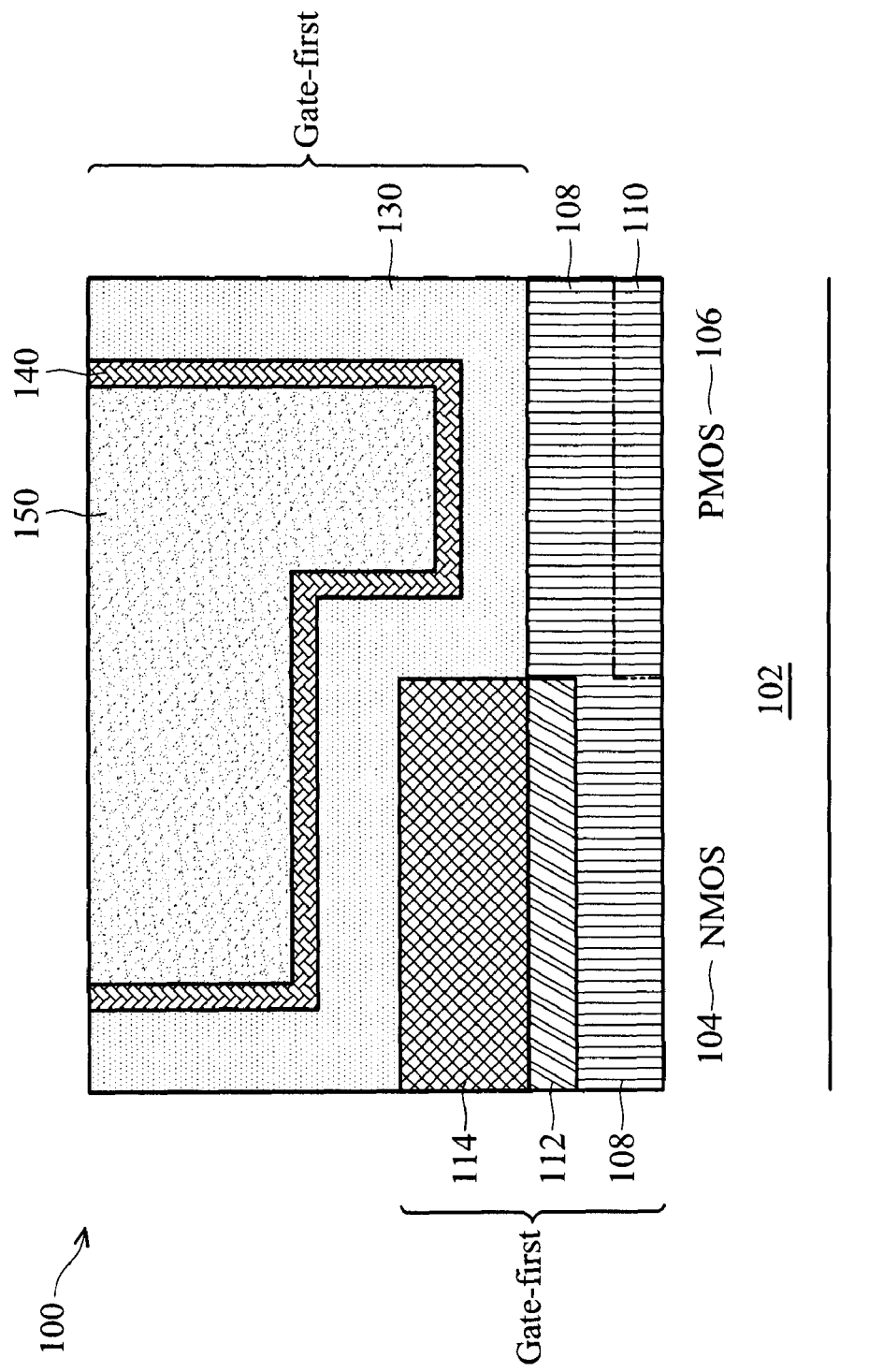

In FIG. 1C, the poly layer 120 in the NMOS region 104 may be removed by an etch process. In FIG. 1D, metal layers may be formed to provide a P-metal work function in the PMOS region 106 and to complete formation of the gate electrode in the NMOS 104 and PMOS 106 regions. For example, a metal layer 130 may be formed on the metal layer 114 in the NMOS region 104 and the high-k dielectric layer 108 in the PMOS region 106. The metal layer 130 may include WN or TiN having a thickness ranging from about 20 to about 150 angstrom (A). The metal layer 130 may be formed by PVD, CVD, or other suitable method. A metal layer 140, such as Ti, may be formed on the metal layer 130. The metal layer 140 may include a thickness ranging from about 20 to about 200 angstrom (A). The metal layer 140 may be formed by PVD, CVD, or other suitable method. A filler metal layer 150, such as Al, may be formed on the metal layer 140 by PVD, CVD, plating, or other suitable method. The metal layer 150 may include a thickness ranging from about 1000 to about 8000 angstrom (A). A CMP process may be performed on the metal layers 130, 140, and 150 to planarize the gate structures in the NMOS 104 and PMOS 106 regions. It is understood that the semiconductor device 100 may undergo further CMOS process flow to form various features such as contacts/vias, interconnects, etc.

Some problems have arisen with forming dual metal gates (e.g., N-metal and P-metal) after the poly etch back process. It has been observed that during the removal of the metal layer 114 in the PMOS region 106 and the removal of poly layer 120 in the NMOS region 104, the underlying high-k dielectric layer 108 may be damaged due to the strong chemicals that are used to remove these layers (that have also undergone several thermal processes). Further, as device features get smaller such as the gate length, chemical fluid into the poly spacing becomes worse and N/P patterning for the poly etch back process in the trench becomes more challenging. Moreover, the process sequence needed for forming the dual metal gates after the poly etch back process is complex as illustrated above.

Figure 2:
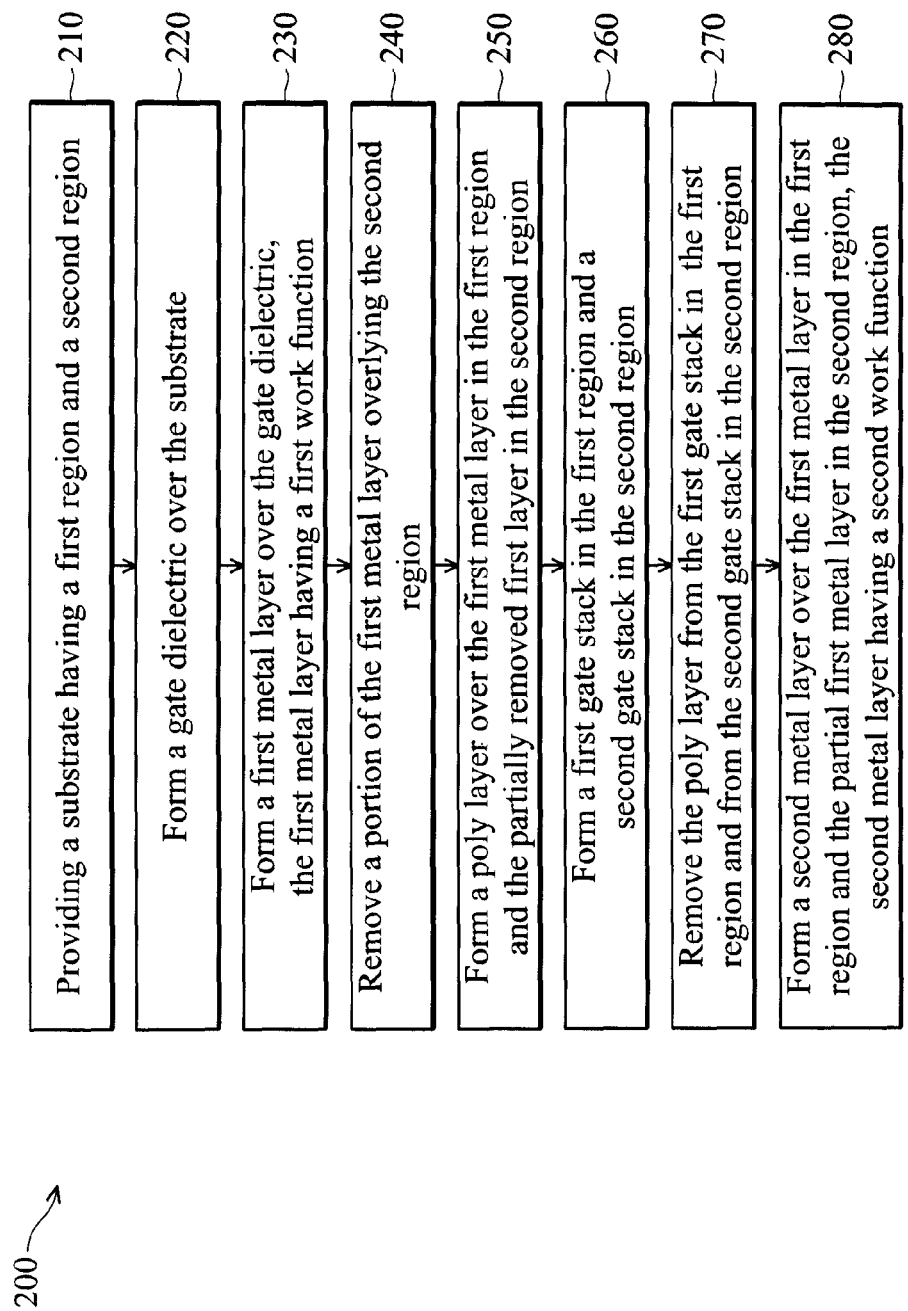
FIG. 2 is a flowchart illustrating a method for fabricating a semiconductor device according to various aspects of the present disclosure.

Referring to FIG. 2, illustrated is a flowchart of a method 200 for fabricating a semiconductor device having dual metal gate structures for an NMOS device and a PMOS device, respectively, according to various aspects of the present disclosure. Referring also to FIGS. 3A to 3F, illustrated are cross-sectional views of a semiconductor device 300 at various stages of fabrication according to the method 200 of FIG. 2. FIGS. 3A to 3F have been simplified to conceptually illustrate gate structures of the NMOS device and PMOS device, respectively, to better understand the inventive concepts of the present embodiment. The semiconductor device 300 may be similar to the semiconductor device 100 of FIG. 1 except for the differences discussed below. Similar features in FIGS. 1 and 3 are numbered the same for the sake of simplicity and clarity.

Figures 3A, 3B:
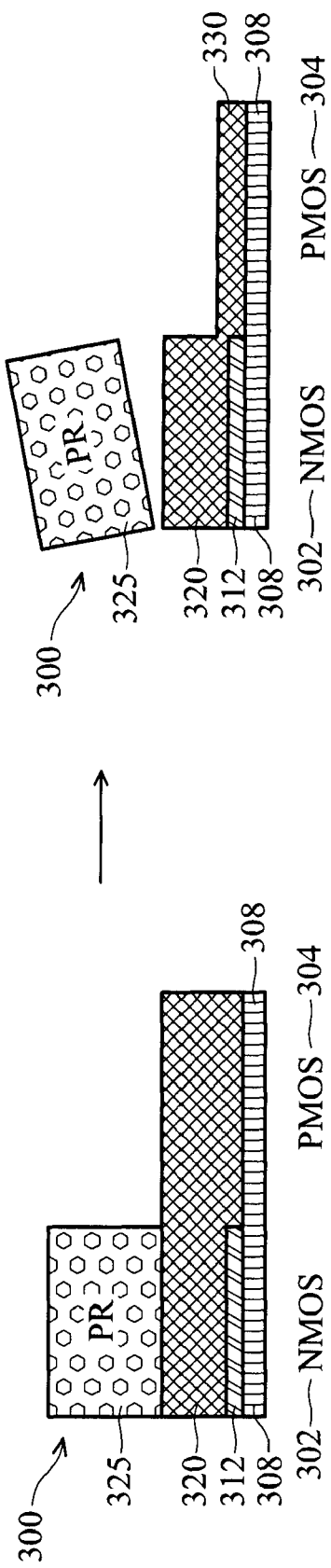
FIGS. 3A to 3F are cross-sectional views of a semiconductor device at various stages of fabrication according to the method of FIG. 2.

The method 200 begins with block 210 in which a semiconductor substrate may be provided, the substrate having a first active region and a second active region. As previously discussed, the semiconductor device 300 may include an NMOS device 302 and a PMOS device 304. In FIG. 3A, the semiconductor device 300 may include an interfacial layer (not shown) of silicon oxide formed over the substrate. The interfacial layer may include a thickness ranging from about 5 to about 15 angstrom (A). The method 200 begins with block 220 in which a high-k dielectric layer may be formed over the substrate. The semiconductor device 300 may further include a high-k dielectric layer 308 formed on the interfacial layer. The high-k dielectric layer 308 may be formed by atomic layer deposition (ALD) or other suitable technique. The high-k dielectric layer 308 may include a thickness ranging from about 10 to about 30 angstrom (A). The high-k dielectric layer 308 may include hafnium oxide (HfO2). Alternatively, the high-k dielectric layer 308 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium lanthanum oxide (HfLaO), hafnium lutetium oxide (HfLuO), and combinations thereof. The semiconductor device 300 may further include a capping layer for tuning a work function of a metal layer for properly performing as an NMOS device 302 and a PMOS device 304, respectively. For example, a capping layer 312 may be formed over the high-k dielectric layer 308 in the NMOS device 302. Another capping layer (not shown) may be formed for tuning the work function in the PMOS device 304.

The method 200 continues with block 230 in which a first metal layer having a first work function may be formed over the high-k dielectric layer. The semiconductor device 300 may further include a metal layer 320 formed over the high-k dielectric layer 308. The metal layer 320 may have a first work function such as an N-metal work function (referred to as N-metal). For example, the metal layer 320 may include TiN having a thickness ranging from about 10 to about 200 angstrom (A). The metal layer 320 may be formed by various deposition techniques such as chemical vapor deposition (CVD), physical vapor deposition (PVD or sputtering), plating, or other suitable technique. The method 200 continues with block 240 in which a portion of the metal layer in the second active region may be removed. Following deposition of the metal layer 320, metal N/P patterning may be performed prior to a poly-gate loop. That is, the metal layer 320 in the PMOS region 304 may be partially removed for N/P patterning prior to deposition of a poly layer and gate patterning. In contrast, metal N/P patterning may be performed after the poly-gate loop as was discussed in FIGS. 1A to 1D. Accordingly, a patterned photoresist layer 325 may be formed overlying the metal layer 320 in the NMOS region 302. The patterned photoresist layer 325 may be formed by photolithography, immersion lithography, or other suitable process discussed above.

Figure 3C:
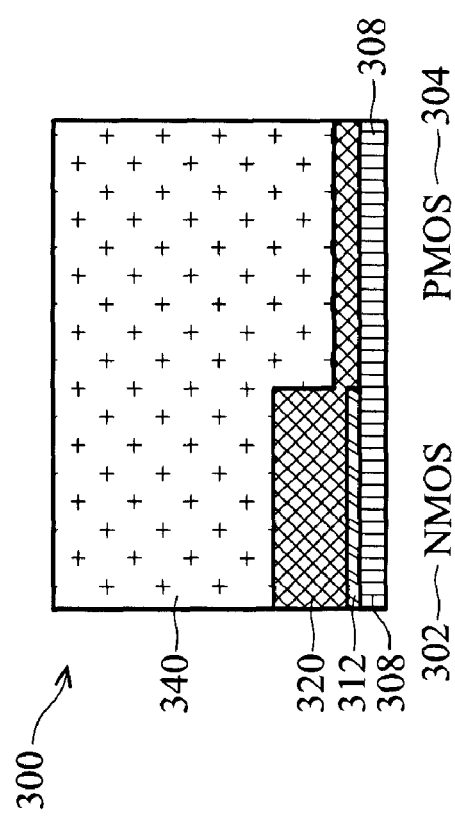
Figure 3D:
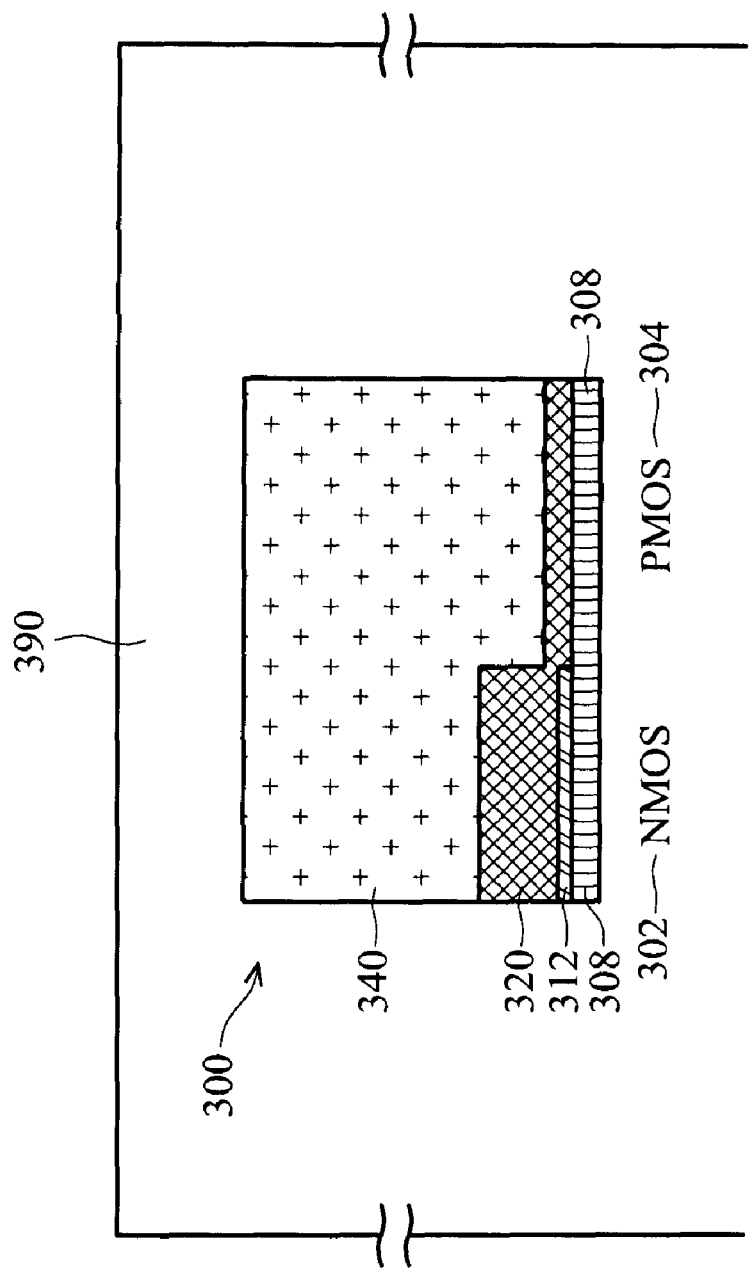

In FIG. 3B, the uncovered portion of the metal layer 320 in the PMOS region 302 may be partially etched resulting in a metal layer 330 in the PMOS region 304. The metal layer 330 may have a smaller thickness than the metal layer 320 in the NMOS region 302. In one embodiment, the metal layer 330 may include a thickness less than about 20 angstrom (A). In other embodiments, the metal layer 330 may include a thickness of about 30 to about 60 angstrom (A). Accordingly, a different metal thickness in the NMOS region 302 and PMOS region 304 may be provided for formation of dual metal gate structures (e.g., N-metal and P-metal). The method 200 continues with block 250 in which a poly layer may be formed over the first metal layer in the first active region and over the partially removed first metal layer in the second active region. In FIG. 3C, a poly layer 340 may be formed over the metal layers 320, 330 by a suitable deposition process. The method 200 continues with block 260 in which a first gate stack may be formed in the first active region and a second gate stack may be formed in the second active region. Thereafter, the semiconductor device 300 may undergo a CMOS process flow to form gate stacks, lightly doped drain (LDD) regions, sidewall spacers, source/drain regions, etc. until deposition of an interlayer dielectric (ILD) 390 (FIG. 3D) over the NMOS region 302 and PMOS region 304. A CMP process may then be performed on the ILD layer 390 to expose the poly layer 340 in the gate stacks of both regions 302 and 304.

Figure 3E:
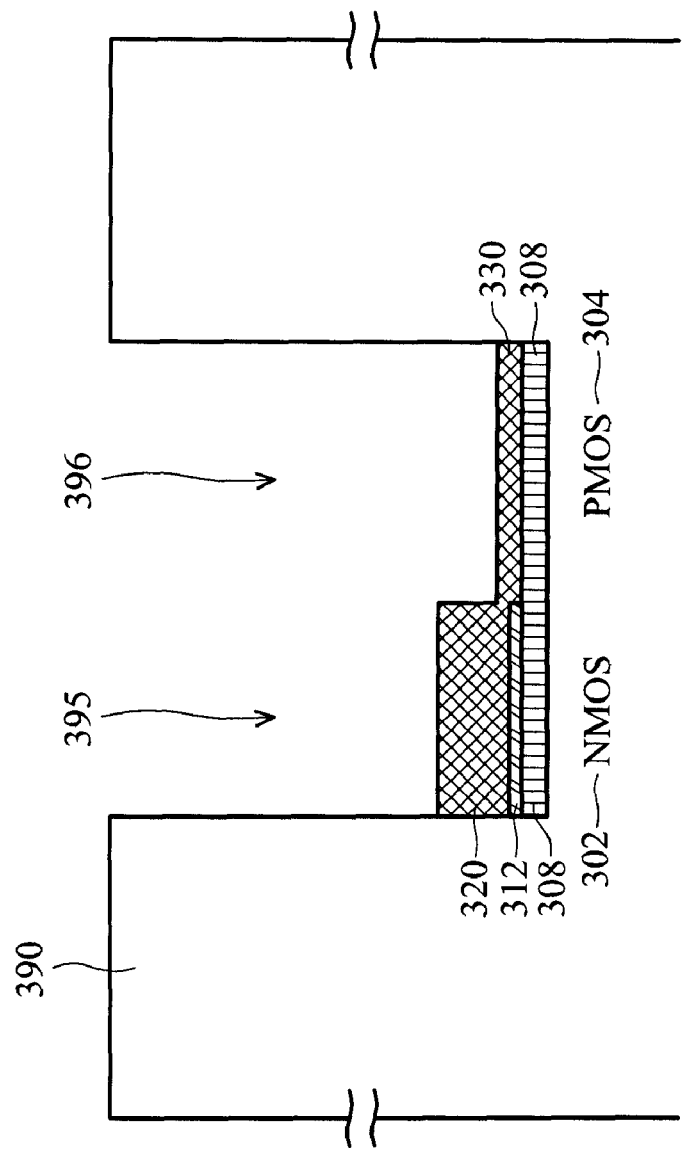

The method 200 continues with block 270 in which the poly layer may be removed from the first gate stack and from the second gate stack without patterning. In FIG. 3E, an etch back process or other suitable process may then be performed to remove the poly layer 340 in both the NMOS region 302 and PMOS region 304 without having to perform metal N/P patterning (to remove the poly layer in one region and then remove the poly layer in the other region as was discussed in FIG. 1). The poly layer 340 in the NMOS region 302 and PMOS region 304 may be removed without N/P patterning since the N-metal was already partially removed in the PMOS region 304 as discussed in FIG. 3B. Therefore, since N/P patterning is not required to remove the N-metal in the PMOS region after formation of the gate stack, the challenge of patterning in the trench 396 (of the poly gate) as the gate length decreases may be minimized. It should also be noted that during the poly etch back process, the risk of damaging the high-k dielectric 308 may be reduced since the metal layers 320, 330 protect the underlying high-k dielectric. Trenches 395, 396 formed from removal of the poly layer 340 are shown in FIG. 3E.

Figure 3F:
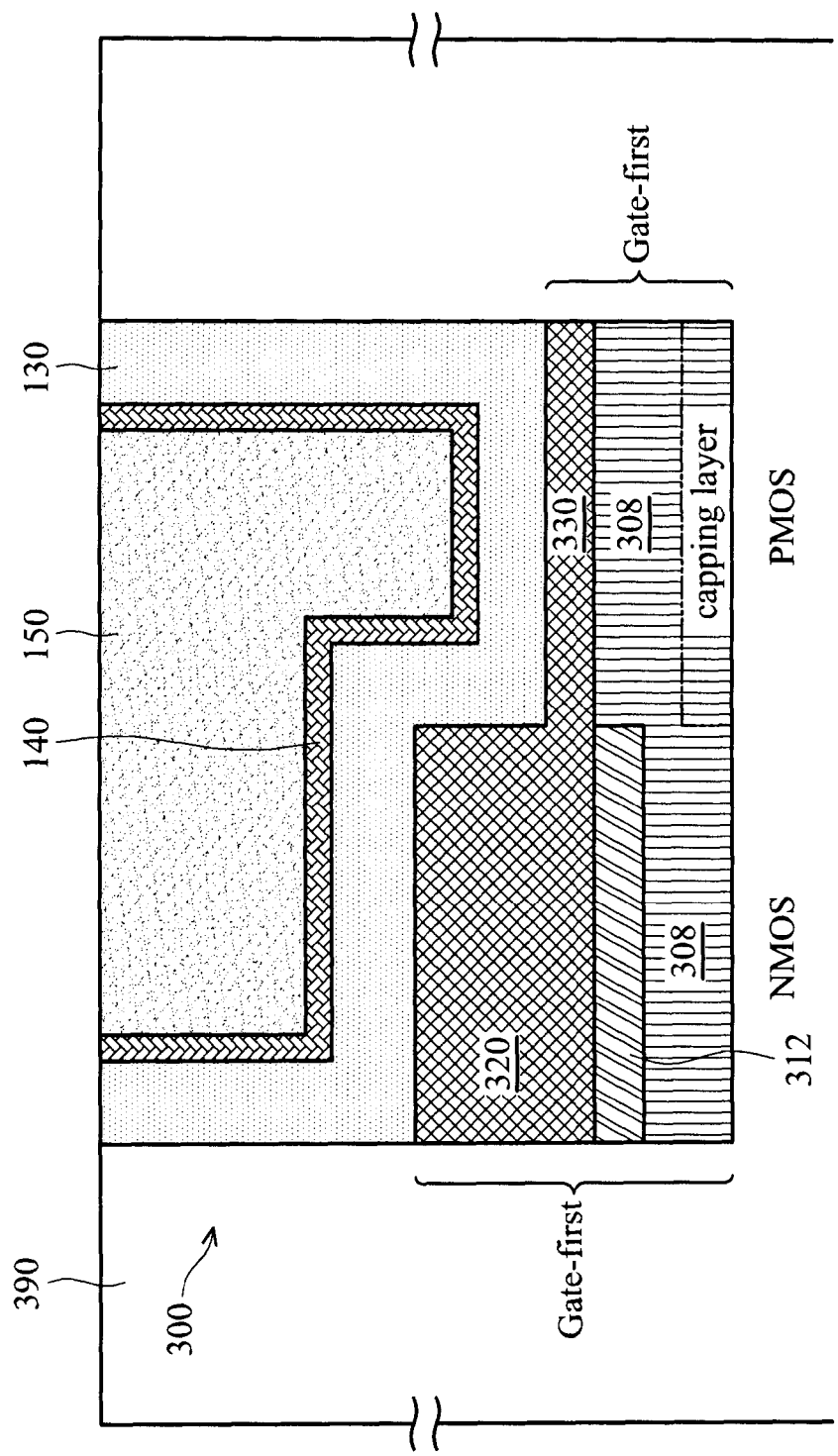

The method 200 continues with block 280 in which a second metal may be formed on the first metal in the first active region and on the partial first metal layer in the second active region. In FIG. 3F, various metal layers may be deposited to form the P-metal in the PMOS region 304 and to complete the gate structures in the NMOS region 302 and the PMOS region 304, respectively. The metal layer 330 in the PMOS region 304 may be sufficiently thin such that the metal layer 330 does not affect the work function when forming the P-metal in the PMOS region. For example, a metal layer 130 may be formed on the metal layer 320 in the NMOS region 302 and the metal layer 330 in the PMOS region 304. The metal layer 130 may include WN or TiN having a thickness ranging from about 20 to about 100 angstrom (A). The metal layer 130 may be formed by PVD, CVD, or other suitable method. A barrier metal layer 140, such as Ti, may be formed on the metal layer 130. The metal layer 140 may include a thickness ranging from about 20 to about 200 angstrom (A). The metal layer 140 may be formed by PVD, CVD, or other suitable method. A filler metal layer 150, such as Al, Cu, W, or other suitable material, may be formed on the metal layer 140 by PVD, CVD, plating, or other suitable method. The metal layer 150 may include a thickness ranging from about 1000 to about 8000 angstrom (A). A CMP process may be performed on the metal layers 130, 140, and 150 to planarize the gate structures in the NMOS 302 and PMOS 304 regions. It is understood that the semiconductor device 300 may undergo further CMOS process flow to form various features such as contacts/vias, interconnect metal layers, interlayer dielectric, passivation layers, etc.

Figure 4:
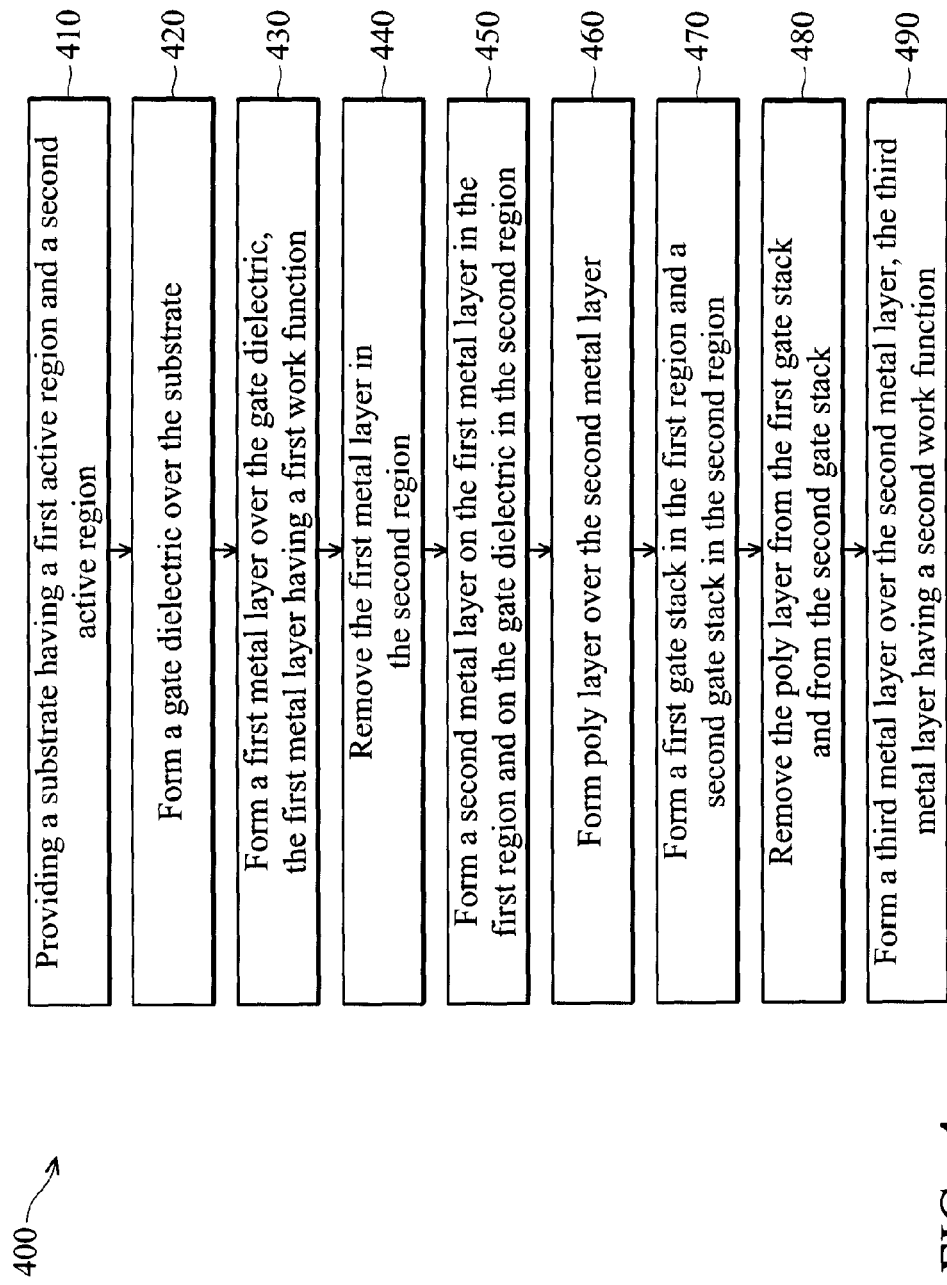
FIG. 4 is a flowchart illustrating an alternative method for fabricating a semiconductor device according to various aspects of the present disclosure.

Referring to FIG. 4, illustrated is a flowchart of an alternative method 400 for fabricating a semiconductor device having dual metal gate structure for an NMOS device and a PMOS device, respectively, according to various aspects of the present disclosure. Referring also to FIGS. 5A to 5G, illustrated are cross-sectional views of a semiconductor device 500 at various stages of fabrication according to the method 400 of FIG. 4. FIGS. 5A to 5G have been simplified to conceptually illustrate gate structures of the NMOS device and PMOS device, respectively, to better understand the inventive concepts of the present embodiment. The semiconductor device 500 may be similar to the semiconductor device 300 of FIG. 3 except for the differences discussed below. Similar features in FIGS. 3 and 5 are numbered the same for the sake of simplicity and clarity.

The method 400 begins with block 410 in which a semiconductor substrate having a first active region and a second active region may be provided. As previously discussed, the semiconductor device 500 may include an NMOS device 502 and a PMOS device 504. The semiconductor device 500 may include an interfacial layer (not shown) of oxide formed over the substrate. The method 400 continues with block 420 in which a high-k dielectric layer may be formed over the substrate. The semiconductor device 500 may further include a high-k dielectric layer 308 formed on the interfacial layer. The high-k dielectric layer 308 may be formed by atomic layer deposition (ALD) or other suitable technique. The high-k dielectric layer 308 may include a thickness ranging from about 10 to about 30 angstrom (A). The high-k dielectric layer 308 may include hafnium oxide (HfO2). Alternatively, the high-k dielectric layer 308 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium lanthanum oxide (HfLaO), hafnium lutetium oxide (HfLuO), and combinations thereof. The semiconductor device 500 may further include a capping layer for tuning a work function of a metal layer for properly performing as an NMOS device 502 and a PMOS device 504, respectively. For example, a capping layer 512 such as lanthanum oxide may be formed over the high-k dielectric layer 308 for tuning the work function in the NMOS device 502. Another capping layer (not shown) such as aluminum oxide may be formed for tuning the work function in the PMOS device 504.

The method 400 continues with block 430 in which a first metal layer may be formed over the high-k dielectric, the first metal layer having a first work function. The semiconductor device 500 may further include a metal layer 320 formed over the high-k dielectric layer 308. The metal layer 320 may have a first work function such as an N-metal work function (referred to as N-metal). For example, the metal layer 320 may include TiN having a thickness ranging from about 10 to about 200 angstrom (A). The metal layer 320 may be formed by various deposition techniques such as chemical vapor deposition (CVD), physical vapor deposition (PVD or sputtering), plating, or other suitable technique. The method 400 continues with block 440 in which the first metal layer in the second active region may be removed. Following deposition of the metal layer 320, metal N/P patterning may be performed prior to a poly-gate loop. That is, the metal layer 320 and capping layer 512 in the PMOS region 504 may be completely removed prior to deposition of a poly layer and gate patterning. In contrast, metal N/P patterning may be performed after the poly-gate loop as was discussed in FIGS. 1A to 1D. Accordingly, a patterned photoresist layer 525 may be formed overlying the metal layer 320 in the NMOS region 502. The patterned photoresist layer 525 may be formed by photolithography, immersion lithography, or other suitable process discussed above.

Figure 5B:
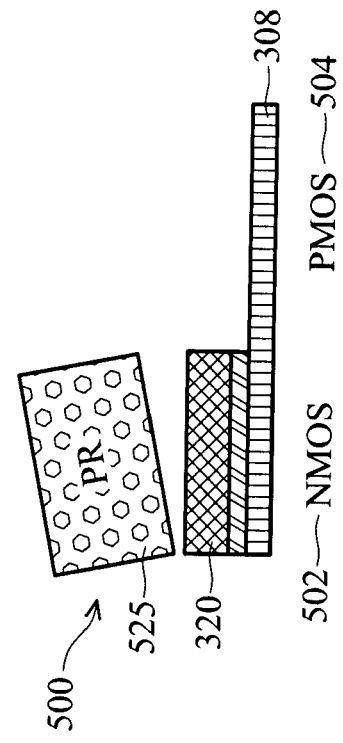
FIGS. 5A to 5G are cross-sectional views of a semiconductor device at various stages of fabrication according to the method of FIG. 4.
Figure 5A:
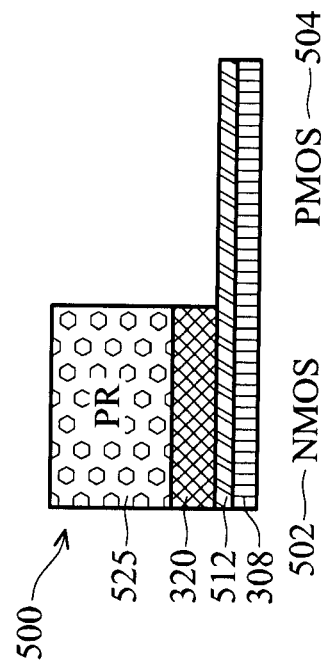
Figure 5D:
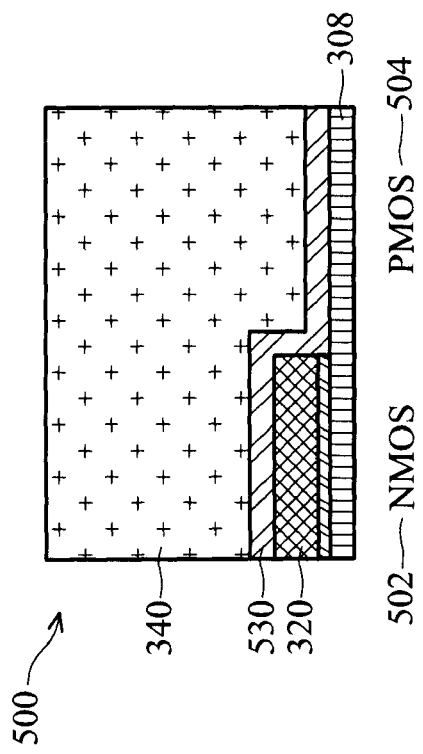
Figure 5C:
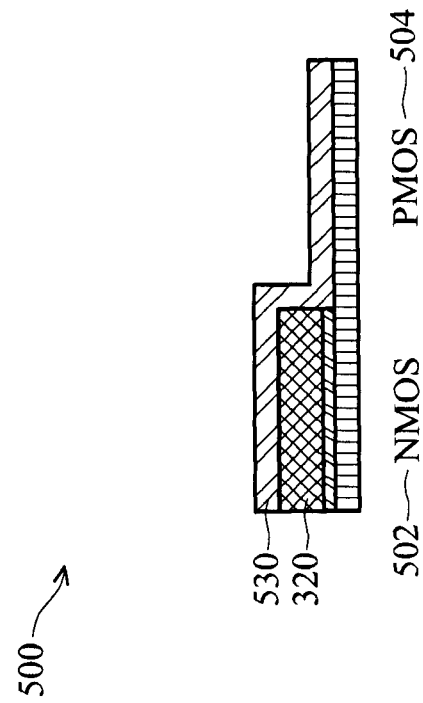
Figure 5E:
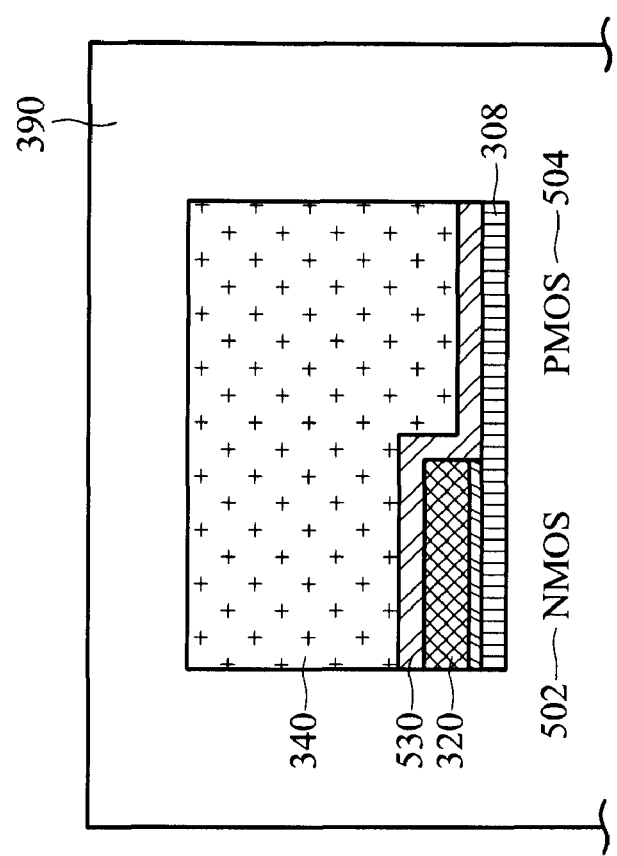

In FIG. 5B, the uncovered portion of the metal layer 320 and capping layer 512 in the PMOS region 504 may be completely etched. The patterned photoresist layer 525 may then be removed by a suitable process. The method 400 continues with block 450 in which a second metal layer may be formed on the first metal layer in the first active region and on the high-k dielectric in the second active region. In FIG. 5C, a metal layer 530 may be formed in the NMOS region 502 and PMOS region 504 by PVD or other suitable process. The metal layer 530 may include a thickness that is less than about 20 angstrom (A), and thus does not effect the work function of the metal layer 320 in the NMOS region 502. Accordingly, the metal layer 530 may include a different material than the metal layer 320. In one embodiment, the metal layer 530 may include a P-metal such as WN. Alternatively, the metal layer 530 may include the same material as metal layer 320 such as TiN. Thus, a different metal thickness in the NMOS region 502 and in the PMOS region 504 may be provided for formation of dual metal gate structures (e.g., N-metal and P-metal).

Figure 5F:
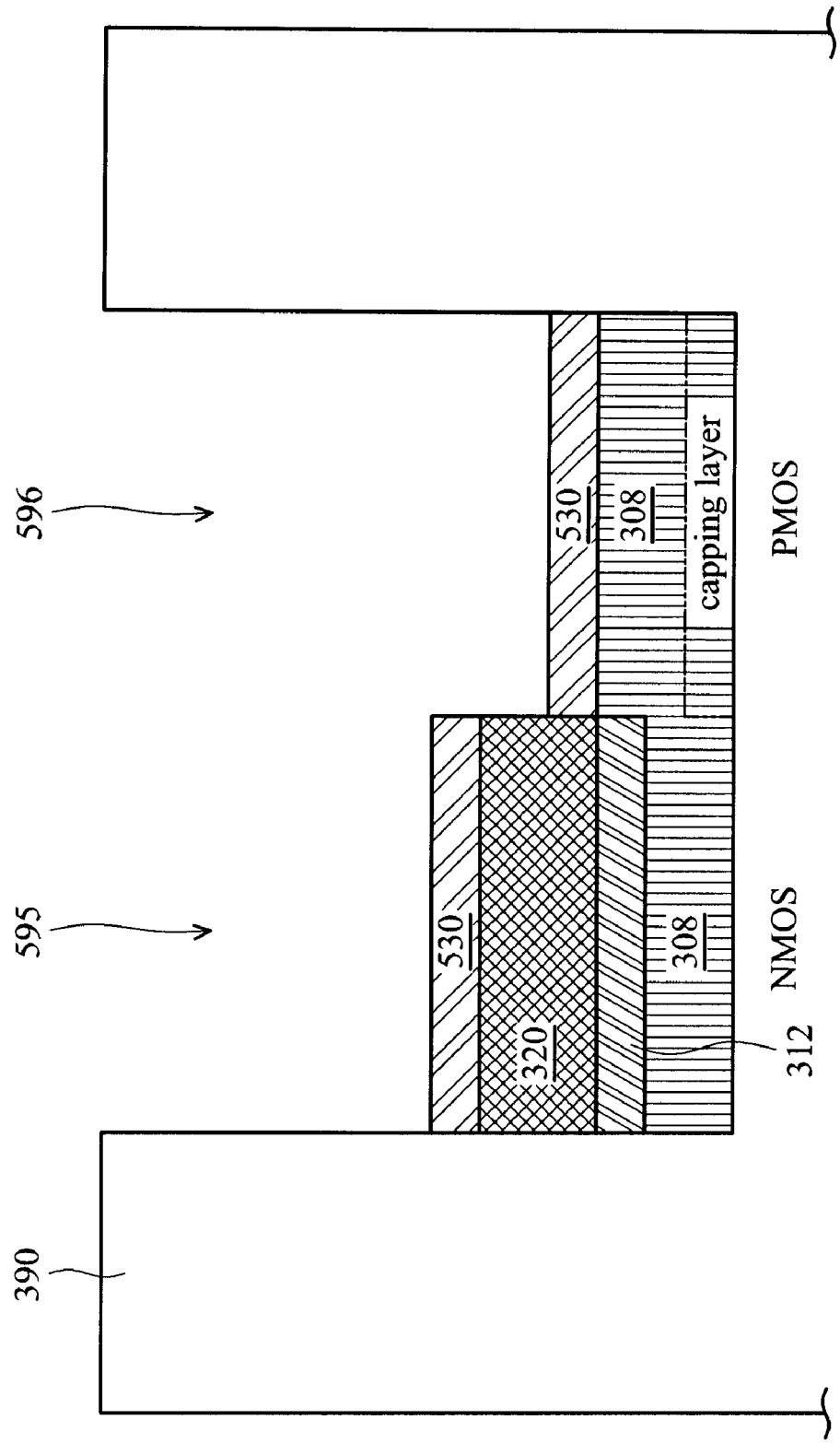

The method 400 continues with block 460 in which a poly layer may be formed on the second metal layer. In FIG. 5D, a poly layer 340 may be formed over the metal layers 320 and 530 in the NMOS region 502 and the metal layer 530 in the PMOS region 504 by a suitable deposition process. Thereafter, the semiconductor device 500 may undergo a similar process flow as discussed in FIGS. 3C to 3F (including formation of ILD 390 in FIG. 5E) to complete formation of metal gate structures (e.g., N-metal and P-metal) for the NMOS region 502 and PMOS region 504. The method 400 continues with block 470 in which a first gate stack may be formed in the first active region and a second gate stack may be formed in the second active region. The method 400 continues with block 480 in which the poly layer 340 may be removed from the first gate stack and from the second gate stack. FIG. 5F shows trenches 595, 596 formed by removal of poly layer 340.

Figure 5G:
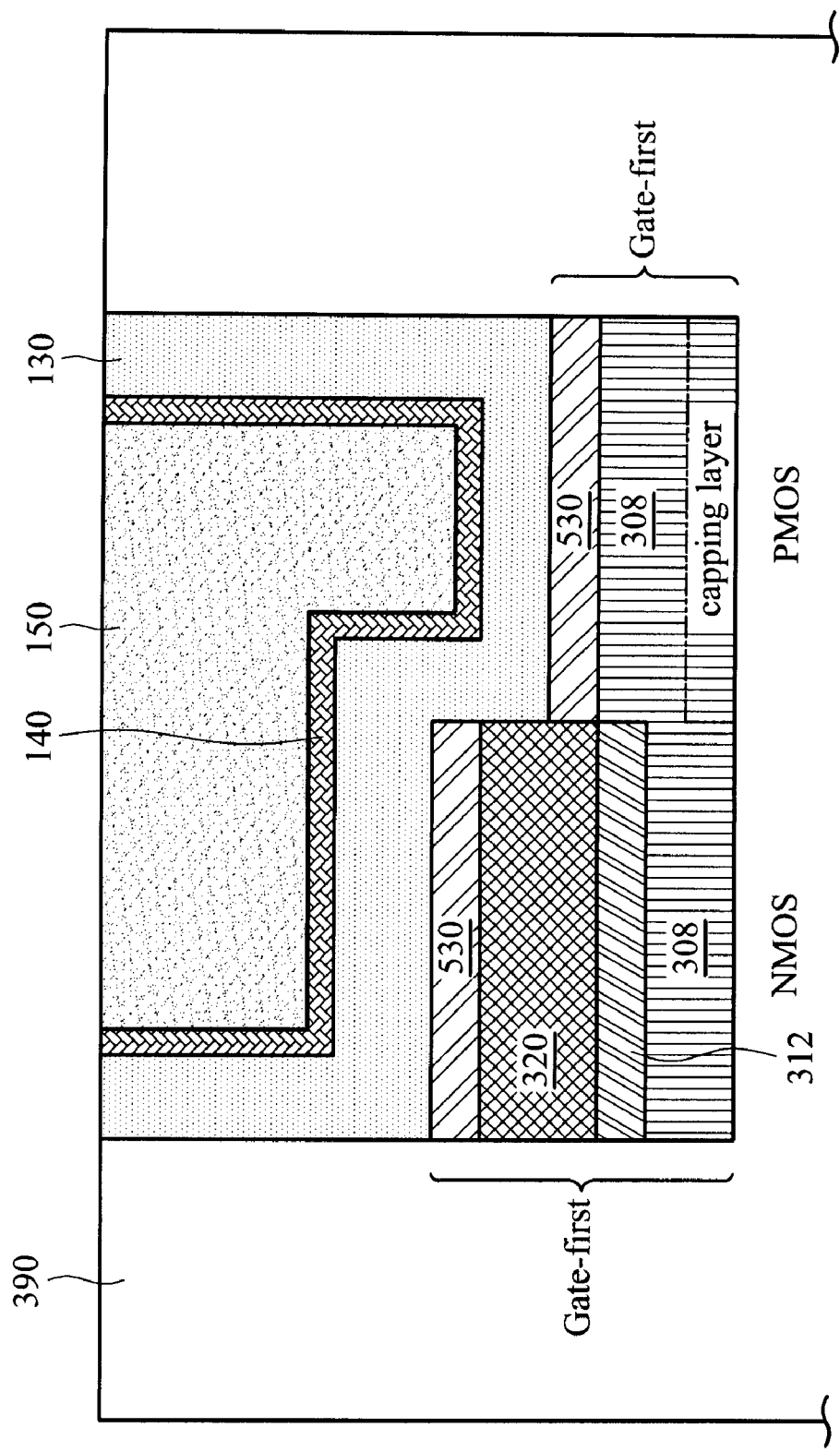

The method 400 continues with block 490 in which a third metal layer may be formed on the second metal layer in the first active region and second active region, the third metal layer having a second work function. In FIG. 5G, various metal layers may be deposited to form the P-metal in the PMOS region 504 and to complete the gate structures in the NMOS region 502 and the PMOS region 504, respectively. For example, a metal layer 130 may be formed on the metal layer 530 in the NMOS region 502 and in the PMOS region 504, respectively. The metal layer 130 may include WN or TiN having a thickness ranging from about 20 to about 100 angstrom (A). The metal layer 130 may be formed by PVD, CVD, or other suitable method. A barrier metal layer 140, such as Ti, may be formed on the metal layer 130. The metal layer 140 may include a thickness ranging from about 20 to about 200 angstrom (A). The metal layer 140 may be formed by PVD, CVD, or other suitable method. A filler metal layer 150, such as Al, Cu, W, or other suitable material, may be formed on the metal layer 140 by PVD, CVD, plating, or other suitable method. The metal layer 150 may include a thickness ranging from about 1000 to about 8000 angstrom (A). A CMP process may be performed on the metal layers 130, 140, and 150 to planarize the gate structures in the NMOS 502 and PMOS 504 regions, respectively. It is understood that the semiconductor device 500 may undergo further CMOS process flow to form various features such as contacts/vias, interconnect metal layers, interlayer dielectric, passivation layers, etc. It should be noted that the advantages discussed in FIG. 3 are also applicable in the present embodiment of FIG. 5.

Figure 6:
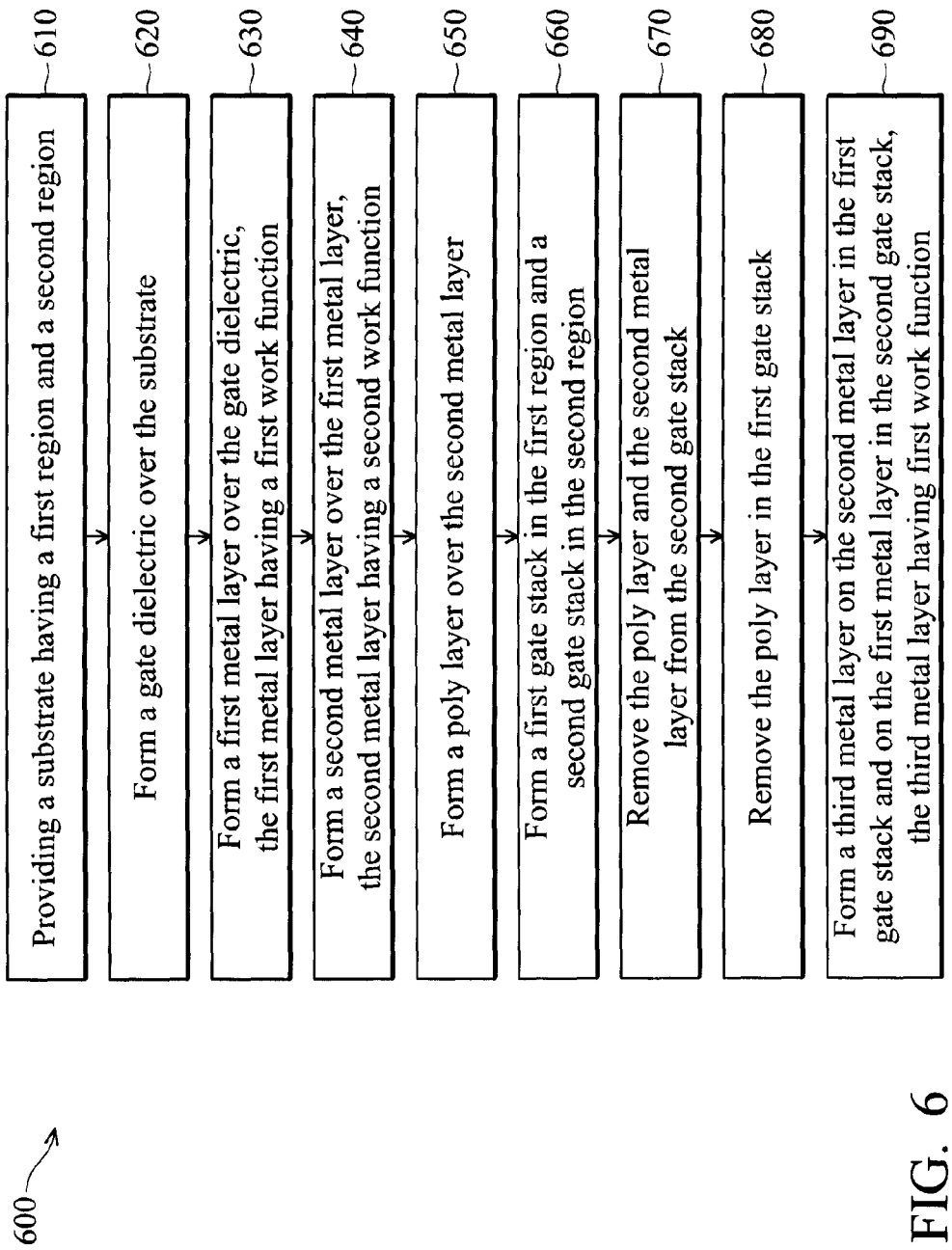
FIG. 6 is a flowchart illustrating another alternative method for fabricating a semiconductor device according to various aspects of the present disclosure.

Referring to FIG. 6, illustrated is a flowchart of another alternative method 600 for fabricating a semiconductor device having a dual gate structure for an NMOS device and a PMOS device, respectively, according to various aspects of the present disclosure. Referring also to FIGS. 7A to 7H, illustrated are cross-sectional views of a semiconductor device 700 at various stages of fabrication according to the method 600 of FIG. 6. FIGS. 7A to 7H have been simplified to conceptually illustrate gate structures of the NMOS device and PMOS device, respectively, to better understand the inventive concepts of the present embodiment.

Figure 7A:
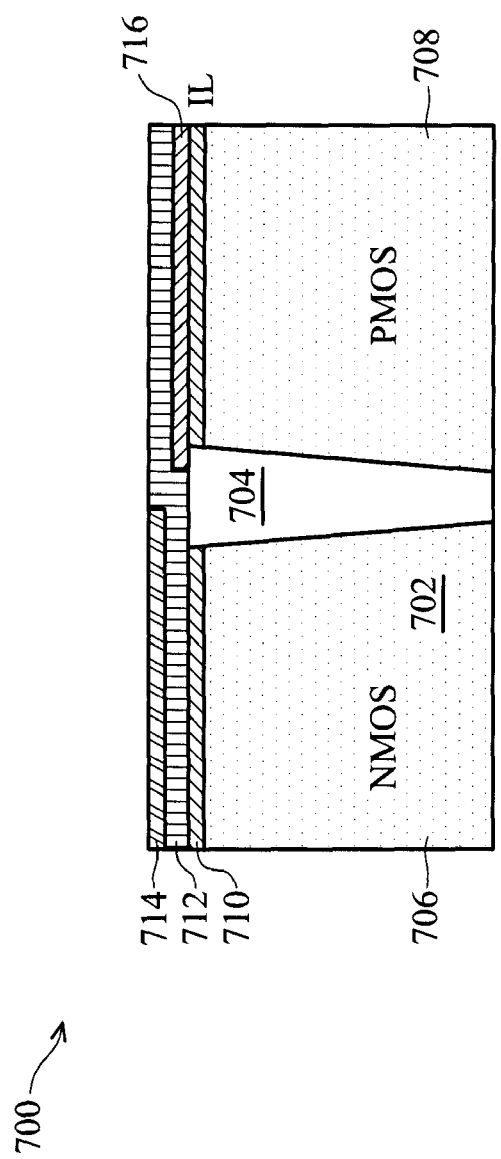
FIGS. 7A to 7H are cross-sectional views of a semiconductor device at various stages of fabrication according to the method of FIG. 6.

The method 600 continues with block 610 in which a semiconductor substrate having a first active region and a second active region may be provided. In FIG. 7A, the semiconductor device 700 may include a semiconductor substrate 702 such as a silicon substrate. The substrate 702 may alternatively include silicon germanium, gallium arsenic, or other suitable semiconductor materials. The substrate 702 may further include other features such as various doped regions, a buried layer, and/or an epitaxy layer. Furthermore, the substrate 702 may be a semiconductor on insulator such as silicon on insulator (SOI). In other embodiments, the semiconductor substrate 702 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 700 may further include an isolation structure 704 such as a shallow trench isolation (STI) feature formed in the substrate 702 for isolating active regions 706 and 708 in the substrate. The isolation structure may be formed of silicon oxide, silicon nitride, silicon oxynitride, fluoride-doped silicate (FSG), and/or a low k dielectric material known in the art. The active region 706 may be configured as an NMOS transistor device and the active region 708 may be configured as a PMOS transistor device.

The semiconductor device 700 may further include an interfacial layer 710 formed over the substrate 702. The interfacial layer may include a silicon oxide layer having a thickness ranging from about 5 to about 15 angstrom (A). The method 600 continues with block 620 in which a high-k dielectric layer may be formed over the substrate. The semiconductor device 700 may further include a high-k dielectric layer 712 formed on the interfacial layer 710. The high-k dielectric layer 712 may be formed by atomic layer deposition (ALD) or other suitable technique. The high-k dielectric layer 712 may include a thickness ranging from about 10 to about 30 angstrom (A). The high-k dielectric layer 712 may include hafnium oxide (HfO2). Alternatively, the high-k dielectric layer 712 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium lanthanum oxide (HfLaO), hafnium lutetium oxide (HfLuO), and combinations thereof.

The semiconductor device 700 may further include a capping layer for tuning a work function of a metal layer (for the gate electrode) for properly performing as an NMOS transistor device 706 and a PMOS transistor device 708, respectively. For example, a capping layer 716 such as aluminum oxide (Al2O3) may be formed in the PMOS region 708. The capping layer 716 may include a thickness ranging from about 3 to about 20 angstrom (A). A capping layer 714 such as lanthanum oxide (LaOx) may be formed in the NMOS region 706. The capping layer 714 may include a thickness ranging from about 3 to about 20 angstrom (A).

Figure 7B:
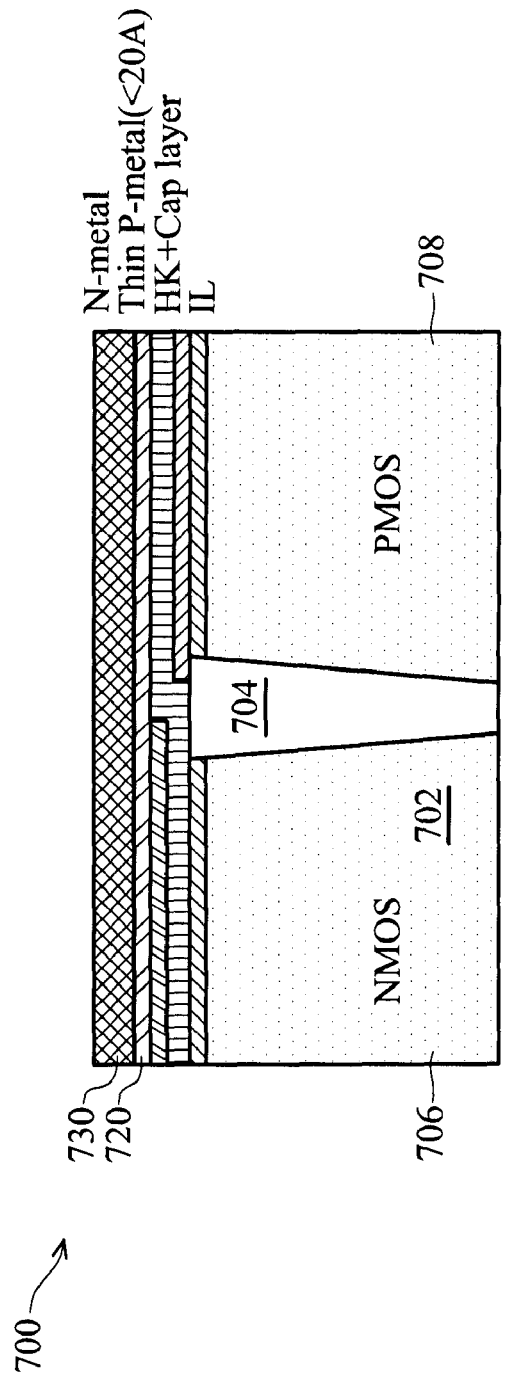

The method 600 continues with block 630 in which a first metal layer may be formed over the high-k dielectric layer, the first metal layer having a first work function. In FIG. 7B, the semiconductor device 700 may further include a P-metal layer 720 formed over the high-k dielectric layer 712. The P-metal layer 720 may include a thickness that is less than 20 angstrom (A) such that the P-metal layer 720 does not effect a work function of a subsequent N-metal layer in the NMOS region 706. The P-metal layer 720 may include various metals such as TaN. The method 600 continues with block 640 in which a second metal layer may be formed over the first metal layer, the second metal layer having a second work function. The semiconductor device 700 may further include an N-metal layer 730 formed over the P-metal layer 720. For example, the N-metal layer 730 may include TiN having a thickness ranging from about 10 to about 200 angstrom (A). The N-metal layer 730 may be formed by various deposition techniques such as chemical vapor deposition (CVD), physical vapor deposition (PVD or sputtering), plating, or other suitable technique.

Figure 7C:
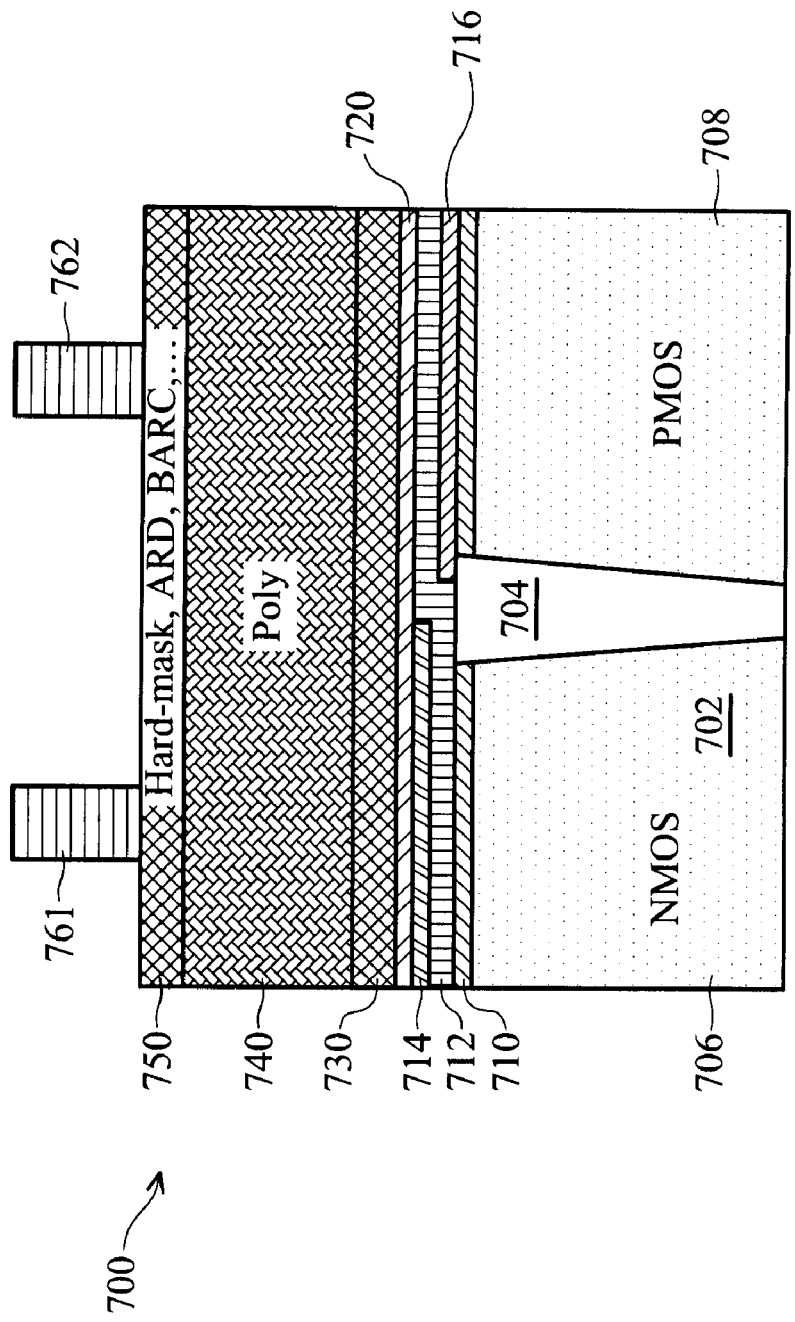

The method 600 continues with block 650 in which a poly layer may be formed over the second metal layer. In FIG. 7C, the semiconductor device 700 may further include a polysilicon (or poly) layer 740 formed over the N-metal layer 730 by a suitable deposition process. The poly layer 740 may include a thickness ranging from about 400 to about 800 angstrom (A). The semiconductor device 700 may further include a hard mask layer 750, such as silicon nitride or silicon oxynitride, formed on the poly layer 740. The hard mask layer 750 may include a thickness ranging from about 100 to about 400 angstrom (A). Further, the semiconductor device 700 may include an antireflective coating layer or bottom antireflective coating (BARC) layer to enhance a photolithography process for patterning a photoresist layer. For example, a patterned photoresist layer may be formed on the hard mask layer 750 including a pattern 761 overlying the NMOS region 706 and a pattern 762 overlying the PMOS region 708. The patterns 761, 762 may be used to pattern the hard mask layer 750 by a dry or wet etch process.

Figure 7D:
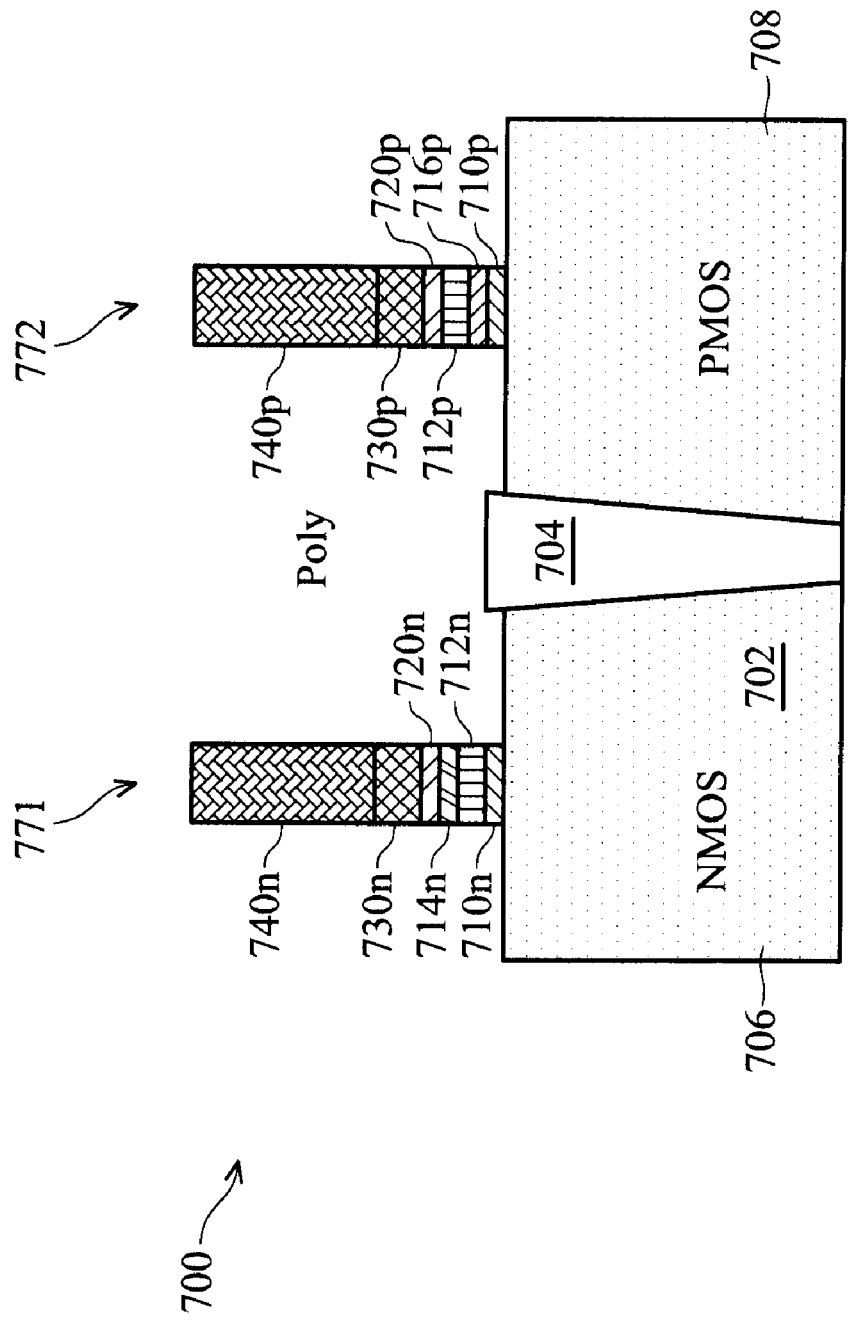

The method 600 continues with block 660 in which a first gate stack may be formed in the first active region and a second gate stack may be formed in the second active region. In FIG. 7D, the patterned hard mask may be used to form a gate stack 771 in the NMOS region 706 and a gate stack 772 in the PMOS region 708. The gate stack 771 may include an interfacial layer 710n, a high-k dielectric 712n, a capping layer 714n, a thin P-metal layer 720n, an N-metal layer 730n, and a poly layer 740n. The gate stack 772 may include an interfacial layer 710p, a capping layer 716p, a high-k dielectric 712p, a thin P-metal layer 720p, an N-metal layer 730p, and a poly layer 740p. It is understood the semiconductor device 700 may continue with CMOS process flow to form various structures such as lightly doped drain regions (LDD), sidewall spacers on the gate stacks, source/drain regions, etc. until deposition of an interlayer dielectric (ILD). Thereafter, a CMP process may be performed in the gate last process to expose the poly layers 740n, 740p of the gate stacks 771, 772, respectively.

Figure 7E:
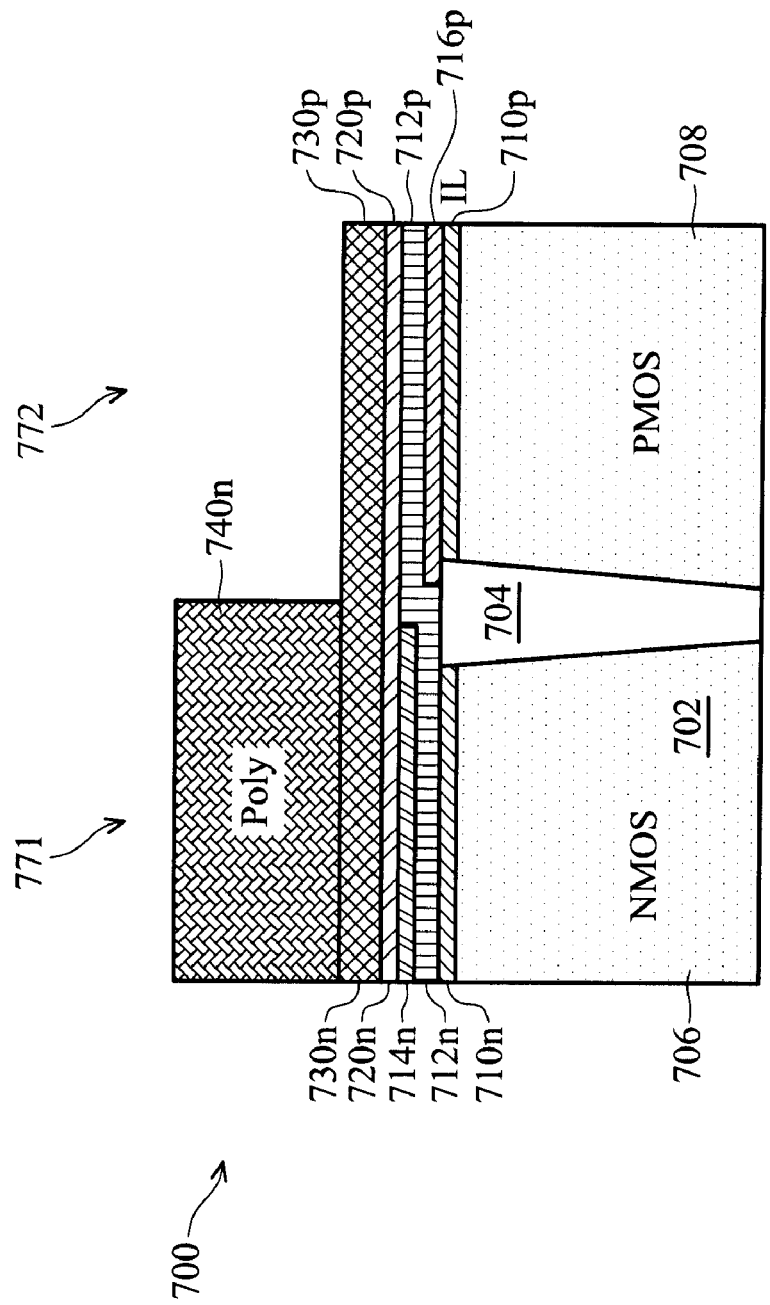

It should be noted that FIGS. 7E to 7H illustrate a more detailed conceptually view of the gate stacks 771, 772 in the NMOS 706 and PMOS 708 regions, respectively. The method 600 continues with block 670 in which the poly layer and the second metal layer may be removed from the second gate stack. In FIG. 7E, an N/P patterning process may be performed to remove the poly layer 740p and the N-metal layer 730p in the PMOS region 708. For example, an N/P photolithography patterning process (PMOS N/P patterning) may be performed to separate the NMOS region 706 and the PMOS region 708. The photolithography process may include spin coating, soft-baking, exposure, post-baking, developing, rinsing, drying, and other suitable process. Alternatively, the N/P patterning may be performed by immersion lithography, electron beam lithography, or other suitable process. The poly layer 740p in the PMOS region 708 may be removed by an etch back process or other suitable process. Following removal of the poly layer 740p in the PMOS region 708, the photoresist (not shown) may be removed or stripped with ash process and the semiconductor device 700 may undergo a polymer dip to remove residues left from the poly etch back process and ash process.

Figure 7F:
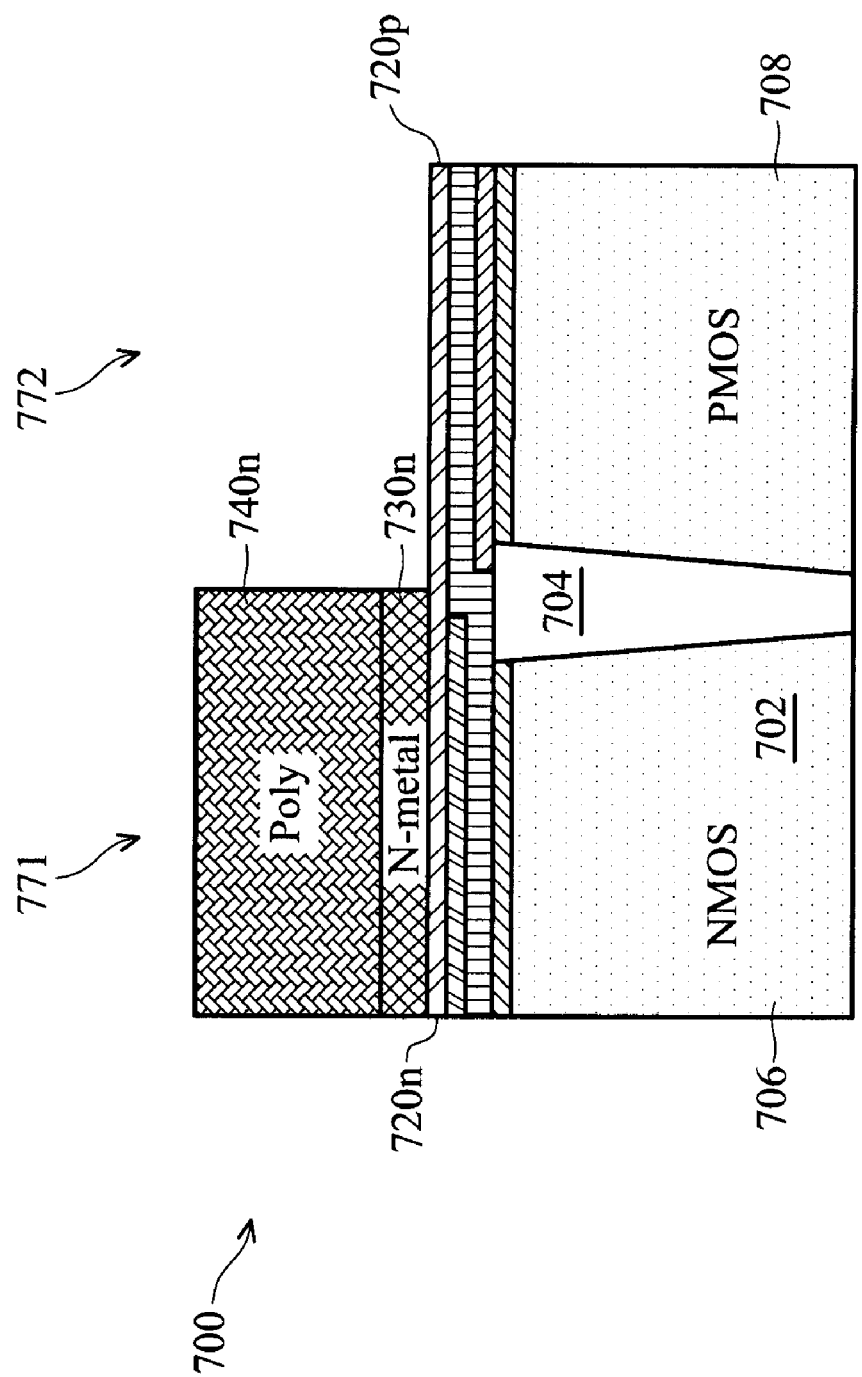
Figure 7G:
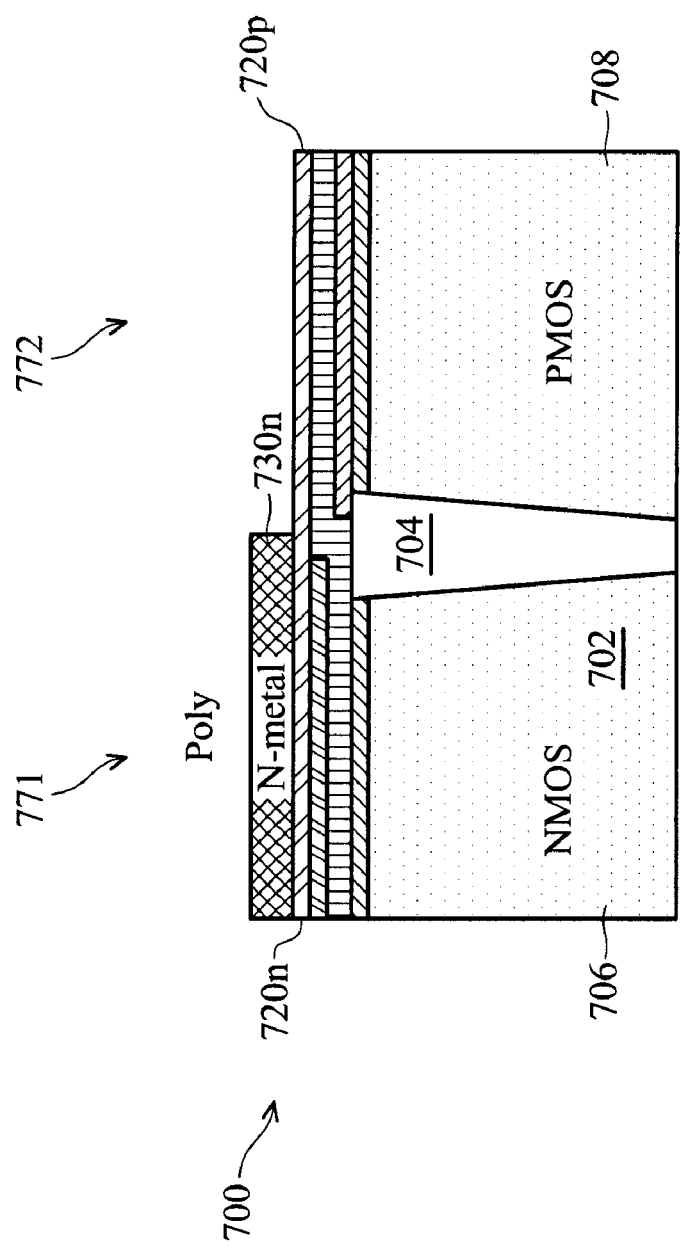

In FIG. 7F, the N-metal layer 730p in the PMOS region 708 may be removed by a wet or dry etch process. It should be noted that the thin P-metal layer 720p in the PMOS region 708 may serve as a protection layer to the underlying high-k dielectric 712p during the removal of the N-metal layer 730p. Also, the thin P-metal layer 720p may provide an etch stop layer for the etching process to remove the N-metal layer 730p. The method 600 continues with block 680 in which the poly layer may be removed from the first gate stack. In FIG. 7G, the poly layer 740n in the NMOS region 706 may be removed by a wet or dry etching process. It should be noted that the thin P-metal layer 720p in the PMOS region 708 may also serve as a protection layer to the underlying high-k dielectric 712p during the removal of the poly layer 740n.

Figure 7H:
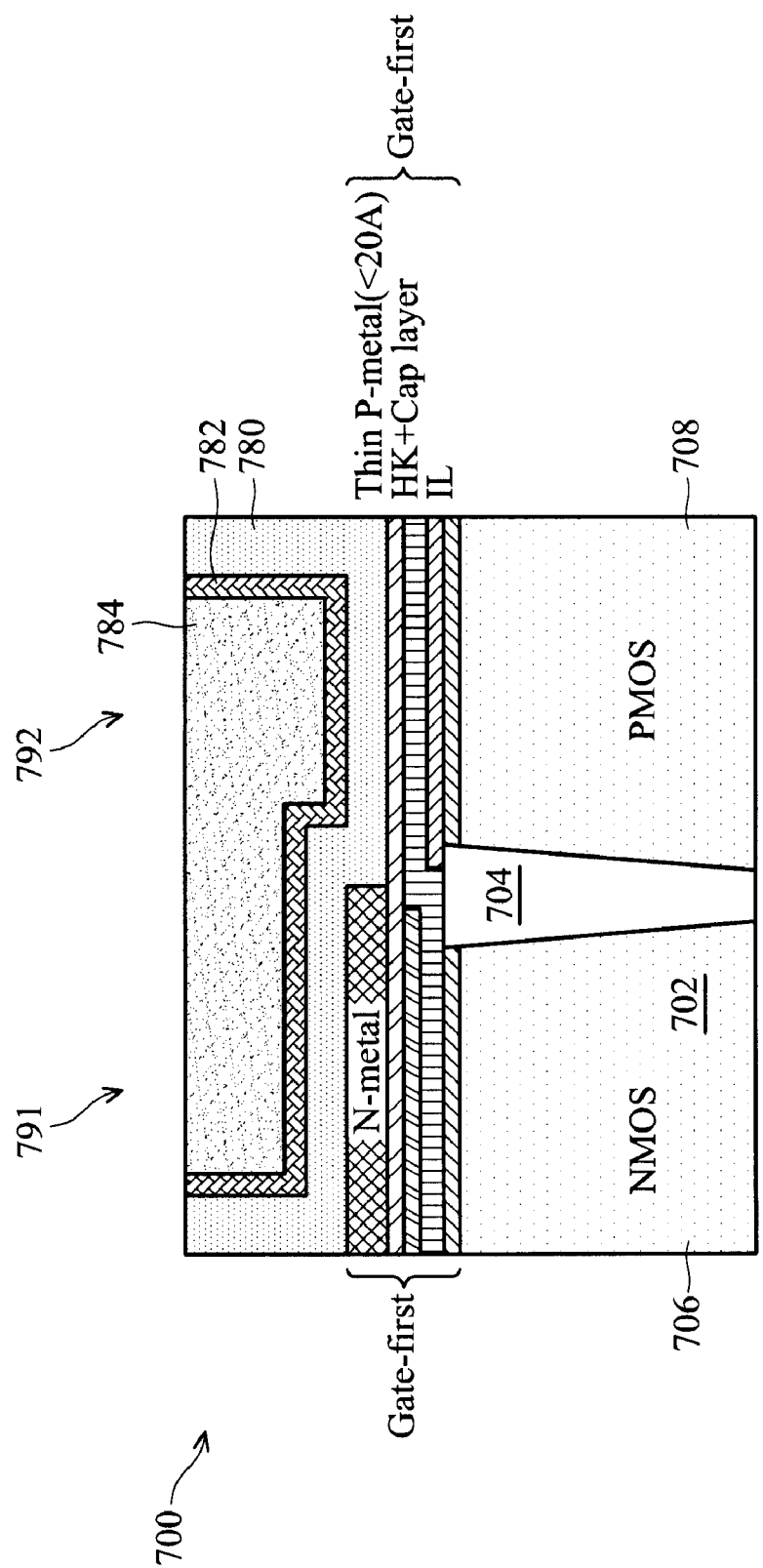

The method 600 continues with block 690 in which a third metal layer may be formed on the second metal layer in the first gate stack, and on the first metal layer in the second gate stack. In FIG. 7H, various metal layers may be deposited in the trenches (the trenches formed from the removal of the poly layer in the gate stack 771 and the poly layer and N-metal in the gate stack 772) to form the P-metal in the PMOS region 708 and to complete gate structures in the NMOS region 706 and the PMOS region 708, respectively. For example, a metal layer 780 may be formed on the N-metal layer 730n in the NMOS region 706 and the P-metal layer 720p in the PMOS region 708. The metal layer 780 may include WN or TiN having a thickness ranging from about 20 to about 100 angstrom (A). The metal layer 780 may be formed by PVD, CVD, or other suitable method. A metal layer 782, such as Ti, may be formed on the metal layer 780. The metal layer 782 may include a thickness ranging from about 20 to about 200 angstrom (A). The metal layer 782 may be formed by PVD, CVD, or other suitable method. A filler metal layer 784, such as Al, Cu, W, or other suitable material, may be formed on the metal layer 782 by PVD, CVD, plating, or other suitable method. The metal layer 784 may include a thickness ranging from about 1000 to about 8000 angstrom (A). A CMP process may be performed on the metal layers 780, 782, and 784 to planarize the gate structures 791, 792 in the NMOS 706 and PMOS 708 regions, respectively. It is understood that the semiconductor device 700 may undergo further CMOS process flow to form various features such as contacts/vias, interconnect metal layers, passivation layers, etc.

Thus, provided is a method for fabricating a semiconductor device that includes providing a semiconductor substrate having a first active region and a second active region, forming a high-k dielectric layer over the semiconductor substrate, forming a first metal layer over the high-k dielectric layer, the first metal layer having a first work function, removing a portion of the first metal layer in the second active region, thereafter, forming a semiconductor layer over the first metal layer in the first active region and over the partially removed first metal layer in the second active region, forming a first gate stack in the first active region and a second gate stack in the second active region, removing the semiconductor layer from the first gate stack and from the second gate stack, and forming a second metal layer on the first metal layer in the first gate stack and on the partially removed first metal layer in the second gate stack, the second metal layer having a second work function.

Further, provided is another method for fabricating a semiconductor device that includes providing a semiconductor substrate having a first active region and a second active region, forming a high-k dielectric layer over the semiconductor substrate, forming a first metal layer over the high-k dielectric layer, the first metal layer having a first work function, removing the first metal layer in the second active region, forming a second metal layer on first metal layer in the first active region and on the high-k dielectric layer in the second active region, thereafter, forming a semiconductor layer over the second metal layer, forming a first gate stack in the first active region and a second gate stack in the second active region, removing the semiconductor layer from the first gate stack and from the second gate stack, and forming a third metal layer on the second metal layer in the first gate stack and the second gate stack, the third metal layer having a second work function.

Additionally, provided is yet another method for fabricating a semiconductor device that includes providing a semiconductor substrate having a first active region and a second active region, forming a high-k dielectric layer over the semiconductor substrate, forming a first metal layer over the high-k dielectric layer, the first metal layer having a first work function, forming a second metal layer on first metal layer, the second metal layer having a second work function, thereafter, forming a semiconductor layer over the second metal layer, forming a first gate stack in the first active region and a second gate stack in the second active region, removing the semiconductor layer and the second metal layer from the second gate stack, removing the semiconductor layer from the first gate stack, forming a third metal layer on the second metal layer in the first gate stack and on the first metal layer in the second gate stack, the third metal layer having the first work function.

Moreover, provided is a semiconductor device that includes a semiconductor substrate having a first active region and a second active region, a first transistor formed in the first active region, the first transistor having a high-k gate dielectric and a first metal gate, a second transistor formed in the second active region, the second transistor having the high-k gate dielectric and a second metal gate. The first metal gate and the second metal gate each includes a first metal layer formed over the high-k gate dielectric and having a first work function. The first metal layers of the first and second metal gates are co-planar. The first metal gate further includes a second metal layer formed on the first metal layer, the second metal layer having a second work function.

The present invention achieves different advantages in various embodiments disclosed herein. For example, the present disclosed method provides a simple and cost-effective method for integrating a high-k/metal gate structure in a CMOS process flow. In some embodiments, N/P patterning may be performed prior to deposition of a poly layer to provide a different thickness for dual metal gate structures (e.g., N-metal and P-metal) for an NMOS device and a PMOS device. Accordingly, the risk of damaging the underlying high-k gate dielectric during etching and deposition processes is reduced and N/P patterning for a poly etch back and metal removal is not required. In other embodiments, a bi-layer metal gate may be provided which includes a thin P-metal layer and N-metal layer. The thin P-metal layer has a thickness that is less than 20 angstrom (A) so that the P-metal layer does not effect the work function of the N-metal layer used for the NMOS device. Accordingly, a hybrid process flow may be implemented to form a dual gate structure for an NMOS and PMOS device. The hybrid process may include a gate first process to form one of the metal gates (e.g., N-metal or P-metal) and a gate last process to form the other of the metal gates (e.g., P-metal or N-metal).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device comprising:
   providing a semiconductor substrate having a first active region and a second active region;
   forming a high-k dielectric layer over the semiconductor substrate;
   forming a first metal layer over the high-k dielectric layer, the first metal layer having a first work function;
   removing at least a portion of the first metal layer in the second active region;
   forming a second metal layer on first metal layer in the first active region and over the high-k dielectric layer in the second active region;
   thereafter, forming a silicon layer over the second metal layer;
   forming a first gate stack in the first active region and a second gate stack in the second active region, the first gate stack including the high-k dielectric layer, the first metal layer, the second metal layer, and the silicon layer, the second gate stack including the high-k dielectric layer, the second metal layer, and the silicon layer;
   forming a dielectric over the silicon layer and semiconductor substrate, then removing a portion of the dielectric over the silicon layer;
   removing the silicon layer from the first gate stack thereby forming a first trench and from the second gate stack thereby forming a second trench; and
   forming a third metal layer over the second metal layer in the first trench and over the second metal layer in the second trench, the third metal layer having a second work function.

2. The method of claim 1, wherein the first metal layer is removed from the second active region; the second metal layer is on the high-k dielectric layer in the second active region.

3. The method of claim 2, wherein the first work function includes an N-metal work function and wherein the second work function includes a P-metal work function.

4. The method of claim 2, further comprising:
   forming an interfacial layer between the semiconductor substrate and the high-k dielectric material;
   forming a first capping layer between the high-k dielectric layer and the first metal layer in the first active region; and
   forming a second capping layer between the interfacial layer and the high-k dielectric layer in the second active region;
   wherein the first gate stack further includes the first capping layer;
   wherein the second gate stack further includes the second capping layer.

5. The method of claim 2, further comprising:
   forming a barrier metal layer over the third metal layer to partially fill in the first and second trenches;
   forming a filler metal layer over the barrier metal layer to substantially fill in the remainder of the first and second trenches; and
   thereafter, performing a chemical mechanical polishing (CMP) to planarize and remove the various layers outside of the first trench of the first gate stack and outside of the second trench of the second gate stack.

6. The method of claim 2, wherein the removing the silicon layer is performed without patterning to separate the first gate stack and the second gate stack.

7. The method of claim 2, wherein the second metal layer includes a thickness less than 20 angstrom (A).

8. The method of claim 2 in which the first and second metal layers comprise a same material.

9. A method of fabricating a Complimentary Metal Oxide Semiconductor (CMOS) device comprising:
   forming a high-k dielectric layer over a semiconductor substrate that includes an NMOS active region and a PMOS active region;
   forming a first metal layer over the high-k dielectric layer, the first metal layer having a first work function;
   removing at least a portion of the first metal layer in the PMOS active region;
   forming a second metal layer over the first metal layer in the NMOS active region and over the high-k dielectric layer in the PMOS active region;
   thereafter, forming a silicon layer over the second metal layer;
   forming a first gate stack in the NMOS active region and forming a second gate stack in the PMOS active region;
   forming a dielectric over the silicon layer and semiconductor substrate, then removing a portion of the dielectric over the silicon layer;
   removing the silicon layer from over the NMOS active region thereby forming a first trench and from over the PMOS active region thereby forming a second trench; and
   forming a third metal layer over the second metal layer in the first trench and over the second metal layer in the second trench, the third metal layer having a second work function.

10. The method of claim 9, wherein the first work function includes an N-metal work function and wherein the second work function includes a P-metal work function.

11. The method of claim 9, further comprising:
    forming an interfacial layer between the semiconductor substrate and the high-k dielectric material;
    forming a first capping layer between the high-k dielectric layer and the first metal layer in the NMOS active region; and forming a second capping layer between the interfacial layer and the high-k dielectric layer in the PMOS active region.

12. The method of claim 9, further comprising:
forming a barrier metal layer over the third metal layer to partially fill in the first and second trenches;
forming a filler metal layer over the barrier metal layer to substantially fill in the remainder of the first and second trenches; and
thereafter, performing a chemical mechanical polishing (CMP) to planarize and remove the various layers outside of the first trench of the first gate stack and outside of the second trench of the second gate stack.

13. The method of claim 9, wherein the removing the silicon layer is performed without patterning.

14. The method of claim 9, wherein the second metal layer includes a thickness less than 20 angstrom (A).

15. The method of claim 9 in which the first and second metal layers comprise different respective materials.

* * * * *